(12) United States Patent
Lu

(10) Patent No.: US 8,972,917 B1
(45) Date of Patent: Mar. 3, 2015

(54) SYSTEM AND METHOD FOR GENERATING A FIELD EFFECT TRANSISTOR CORNER MODEL

(71) Applicant: International Business Machines Corporation, Armonk, NY (US)

(72) Inventor: Ning Lu, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/037,433

(22) Filed: Sep. 26, 2013

(51) Int. Cl.
*G06F 17/50* (2006.01)

(52) U.S. Cl.
CPC ........ *G06F 17/5036* (2013.01); *G06F 17/5068* (2013.01)
USPC ...................................................... 716/112

(58) Field of Classification Search
CPC ................................. G06F 17/30; G06F 17/50
USPC ........................................................... 716/112
See application file for complete search history.

(56) References Cited

U.S. PATENT DOCUMENTS

| | | | |
|---|---|---|---|
| 6,606,729 B2 * | 8/2003 | Gross et al. ..................... | 716/50 |
| 6,901,570 B2 | 5/2005 | Lu | |
| 7,487,475 B1 | 2/2009 | Kriplani et al. | |
| 7,640,143 B2 | 12/2009 | Bittner et al. | |
| 8,214,779 B2 | 7/2012 | Lu | |
| 2006/0150129 A1 * | 7/2006 | Chiu et al. ........................ | 716/4 |
| 2008/0195359 A1 * | 8/2008 | Barker et al. ..................... | 703/2 |
| 2009/0248387 A1 * | 10/2009 | Singhee et al. ................. | 703/16 |

OTHER PUBLICATIONS

Rappitsch, et al., "SPICE Modeling of Process Variation Using Location Depth Corner Models," IEEE Transaction on Semiconductor Manufacturing, vol. 17, No. 2, May 2004, pp. 201-213.
Zhao, et al., "Rigorous Extraction of Process Variations for 65-nm CMOS Design," IEEE Transactions on Semiconductor Manufacturing, vol. 22, No. 1, Feb. 2009, pp. 196-203.
Eikyu, et al., "Global Identification of Variability Factors and Its Application to the Statistical Worst-Case Model Generation," SISPAD 2006, IEEE, pp. 154-157.
Salzmann, et al., "Algorithm for Fast Statistical Timing Analysis," IEEE, 2007, 4 pages.

(Continued)

*Primary Examiner* — Vuthe Siek
*Assistant Examiner* — Mohammed Alam
(74) *Attorney, Agent, or Firm* — Gibb & Riley, LLC; Anthony J. Canale

(57) ABSTRACT

Disclosed are a system, method and computer program product for generating a field effect transistor (FET) corner model for a performance target (e.g., delay) that accurately preserves partial correlations among involved statistical model parameters (e.g., channel lengths, threshold voltages, overlap capacitance, etc.) of different types of field effect transistors within an integrated circuit. To accomplish this, an initial simulation run is performed to determine a nominal performance value with all statistical model parameters set at their nominal values. Then, multiple additional simulation runs are performed to determine corner performance values. In each successive additional simulation run, statistical model parameters of the different types of field effect transistors are offset from their nominal model parameters values in correlated ways. Then, based on performance differences between each of the corner performance values and the nominal performance value, a standard deviation for the performance target is determined.

20 Claims, 9 Drawing Sheets

(56) References Cited

OTHER PUBLICATIONS

IPCOM000225381D, "Method for Compensation of Off-Center Timing Models Using Statistical Timing," Feb. 12, 2013, 3 pages.
IPCOM000133170D, "Method of Automatically Detecting and Distinguishing Monte-Carlo Analysis with non-Monte-Carlo Analysis," Jan. 16, 2006, 4 pages.
IPCOM000194409D, "Method and System for Generating Flexible Corner Models," Mar. 23, 2010, 4 pages.

* cited by examiner $$\begin{pmatrix} C_{11} & C_{12} & C_{13} & C_{14} \\ C_{21} & C_{22} & C_{23} & C_{24} \\ C_{31} & C_{32} & C_{33} & C_{34} \\ C_{41} & C_{42} & C_{43} & C_{44} \end{pmatrix} = \begin{pmatrix} 1 & 7/8 & 0.5 & 0.5 \\ 7/8 & 1 & 0.5 & 0.5 \\ 0.5 & 0.5 & 1 & 7/8 \\ 0.5 & 0.5 & 7/8 & 1 \end{pmatrix}.$$

FIG. 6

$$\begin{pmatrix} C_{rvtn,rvtn} & C_{rvtn,rvtp} \\ C_{rvtp,rvtn} & C_{rvtp,rvtp} \end{pmatrix} = \begin{pmatrix} C_{22} & C_{24} \\ C_{42} & C_{44} \end{pmatrix} = \begin{pmatrix} 1 & 0.5 \\ 0.5 & 1 \end{pmatrix}.$$

FIG. 7

SYSTEM AND METHOD FOR GENERATING A FIELD EFFECT TRANSISTOR CORNER MODEL

BACKGROUND

The system and method disclosed herein relate to generating a field effect transistor (FET) corner model and, more particularly, to generating a FET corner model that preserves the partial correlations between statistical model parameters (e.g., channel lengths, threshold voltages, overlap capacitances, channel widths, etc.) of different types of FETs within an integrated circuit.

Typically, partial correlations exist between certain statistical model parameters (e.g., channel lengths, threshold voltages, overlap capacitances, channel widths, etc.) of different types of field effect transistors (e.g., a low threshold voltage n-type field effect transistor (LVT nFET), a low threshold voltage p-type field effect transistor (LVT pFET), a regular threshold voltage n-type field effect transistor (RVT nFET), a regular threshold voltage p-type field effect transistor (RVT pFET), a high threshold voltage n-type field effect transistor (HVT nFET), a high threshold voltage p-type field effect transistor (HVT pFET), etc.) with regard to performance (e.g., delay of logic gates) within the same integrated circuit. Those skilled in the art will recognize that a "partial correlation" is a measurable degree of association between two otherwise random variables. It would be advantageous to be able to generate a FET corner model that accurately preserves these partial correlations without requiring a significant number (e.g., hundreds, thousands or tens of thousands) of simulations.

SUMMARY

In view of the foregoing, disclosed herein are a system, method and computer program product for generating a field effect transistor (FET) corner model for a given performance target (e.g., delay of logic gates) that accurately preserves partial correlations between corresponding statistical model parameters (e.g., channel lengths, threshold voltages, overlap capacitances, channel widths, etc.) of different types of field effect transistors within an integrated circuit. To accomplish this, an initial simulation run is performed to determine a nominal performance value (e.g., a nominal delay value) with all statistical model parameter values of the field effect transistors set at their nominal model parameter values (e.g., nominal channel length values, nominal threshold voltage values, nominal overlap capacitance values, nominal channel widths, etc.). Then, multiple additional simulation runs are performed to determine corner performance values (e.g., corner delay values). In each successive additional simulation run, the statistical model parameters of the different types of field effect transistors are properly set at different model parameter values (e.g., different channel length values, different threshold voltage values, different overlap capacitance values, different channel widths, etc.) that are offset from their nominal model parameters values in correlated ways. Then, based on performance differences between each of the corner performance values and the nominal performance value, a standard deviation for the performance target is determined. This technique preserves the partial correlations between the statistical model parameters of the different types of field effect transistors and does so without requiring the performance of a large number of simulations and without requiring knowledge of the sensitivities of the performance target.

More particularly, disclosed herein is a computer system for modeling integrated circuit performance. This computer system can comprise a memory and at least one processor.

The memory can store a design for an integrated circuit. This integrated circuit can comprise at least two different types of field effect transistors. For example, the integrated circuit can comprise any two or more of the following: a low threshold voltage n-type field effect transistor (LVT nFET), a low threshold voltage p-type field effect transistor (LVT pFET), a regular threshold voltage n-type field effect transistor (RVT nFET), a regular threshold voltage p-type field effect transistor (RVT pFET), a high threshold voltage n-type field effect transistor (HVT nFET), a high threshold voltage p-type field effect transistor (HVT pFET), etc.

The processor(s) can access the design in the memory and can generate a corner model for a performance target that preserves partial correlations between corresponding statistical model parameters of the different types of field effect transistors. The performance target can comprise, for example, delay of logic gates. The corresponding statistical model parameters can comprise, for example, channel lengths, threshold voltages, overlap capacitances or channel widths.

To accomplish this, the processor(s) can perform an initial simulation run to determine a nominal performance value. During the initial simulation run, the values of the corresponding statistical model parameters (e.g., the channel length values, the threshold voltage values, the overlap capacitance values, or channel width values) of the two or more different types of field effect transistors can be set at their respective nominal model parameter values (e.g., nominal channel length values, nominal threshold voltage values, nominal overlap capacitance values, or nominal channel width values, respectively). The processor(s) can further perform multiple additional simulation runs to determine corner performance values. During each successive additional simulation run, the values of the corresponding statistical model parameters (e.g., the channel length values, the threshold voltage values, the overlap capacitance values or the channel width values) of the two or more different types of field effect transistors can be set at different model parameter values that are offset from their respective nominal model parameters values in correlated ways.

Once the simulation runs are preformed as described above, the processor(s) can determine a standard deviation for the performance target based on performance differences between each of the corner performance values and the nominal performance value.

For example, in the system described above, an initial simulation run can be performed by the processor(s) to determine a nominal delay value of the logic gates. During the initial simulation run, the corresponding channel length values of the two or more different types of field effect transistors can be set at their respective nominal channel length values. Next, multiple additional simulation runs can be performed by the processor(s) to determine corner delay values. During each successive additional simulation run, the corresponding channel length values of the two or more different types of field effect transistors can be set at different channel length values that are offset from their respective nominal channel length values in correlated ways. Once the simulation runs are preformed, the processor(s) can determine a standard deviation for the delay value based on delay differences between each of the corner delay values and the nominal delay value.

Also disclosed herein is a computer-implemented method for modeling integrated circuit performance.

The method can comprise accessing, from a memory accessible by a computer system, a design for an integrated circuit. This integrated circuit can comprise at least two different types of field effect transistors. For example, the integrated circuit can comprise any two or more of the following: a low threshold voltage n-type field effect transistor (LVT nFET), a low threshold voltage p-type field effect transistor (LVT pFET), a regular threshold voltage n-type field effect transistor (RVT nFET), a regular threshold voltage p-type field effect transistor (RVT pFET), a high threshold voltage n-type field effect transistor (HVT nFET), a high threshold voltage p-type field effect transistor (HVT pFET), etc.

The method can further comprise generating, by the computer system, a corner model for a performance target that preserves partial correlations between corresponding statistical model parameters of the different types of field effect transistors. The performance target can comprise, for example, delay of logic gates. The corresponding statistical model parameters can comprise, for example, channel lengths, threshold voltages, overlap capacitances, or channel widths.

To accomplish this, an initial simulation run can be performed to determine a nominal performance value. During the initial simulation run, the values of the corresponding statistical model parameters of the two or more different types of field effect transistors can be set at their respective nominal model parameter values. The multiple additional simulation runs can be performed to determine corner performance values. During each successive additional simulation run, the values of the corresponding statistical model parameters of the two or more different types of field effect transistors can be set at different model parameter values that are offset from their respective nominal model parameters values in correlated ways.

Once the simulation runs are preformed as described above, a standard deviation for the performance target can be determined based on performance differences between each of the corner performance values and the nominal performance value.

For example, in the method described above, an initial simulation run can be performed to determine a nominal delay value. During the initial simulation run, the corresponding channel length values of the two or more different types of field effect transistors can be set at their respective nominal channel length values. Next, multiple additional simulation runs can be performed to determine corner delay values. During each successive additional simulation run, the corresponding channel length values of the two or more different types of field effect transistors can be set at different channel length values that are offset from their respective nominal channel length values in correlated ways. Once the simulation runs are preformed, a standard deviation for the delay value can be determined based on delay differences between each of the corner delay values and the nominal delay value.

Also disclosed herein are embodiments of a computer program product. This computer program product can comprise a computer readable storage medium, which stores computer program code. The computer program code can be executable by a computer to perform the above-described method.

BRIEF DESCRIPTION OF THE DRAWINGS

The embodiments herein will be better understood from the following detailed description with reference to the drawings, which are not necessarily drawn to scale and in which:

FIG. 6 is an exemplary correlation matrix illustrating exemplary partial correlations that may exist between the channel lengths of four different types of FETs in an exemplary integrated circuit;

FIG. 7 is another exemplary correlation matrix illustrating exemplary partial correlations between the channel lengths of only two of four different types of FETs in a set of statistical models as shown in FIG. 6, when only those two FETs affect a performance target;

DETAILED DESCRIPTION

As mentioned above, typically, partial correlations exist between certain statistical model parameters (e.g., channel lengths, threshold voltages, overlap capacitances, channel widths, etc.) of different types of field effect transistors (e.g., a low threshold voltage n-type field effect transistor (LVT nFET), a low threshold voltage p-type field effect transistor (LVT pFET), a regular threshold voltage n-type field effect transistor (RVT nFET), a regular threshold voltage p-type field effect transistor (RVT pFET), a high threshold voltage n-type field effect transistor (HVT nFET), a high threshold voltage p-type field effect transistor (HVT pFET), etc.) with regard to performance (e.g., delay of logic gates) within the same integrated circuit. Those skilled in the art will recognize that a "partial correlation" is a measurable degree of association between two otherwise random variables.

Techniques for generating a FET corner model typically (i) do not preserve these partial correlations, (ii) preserve them but require a significant number (e.g., hundreds, thousands or tens of thousands) of simulations in order to do so accurately, or (iii) preserve them but do not do so accurately. For illustration purposes, such techniques are described below with respect to an integrated circuit comprising a simple complementary metal oxide semiconductor (CMOS) inverter with an n-type field effect transistor (nFET) electrically connected in series to a p-type field effect transistor (pFET), a performance target comprising delay of the inverter and corresponding statistical model parameters with partial correlations comprising channel lengths.

Figure 1A:
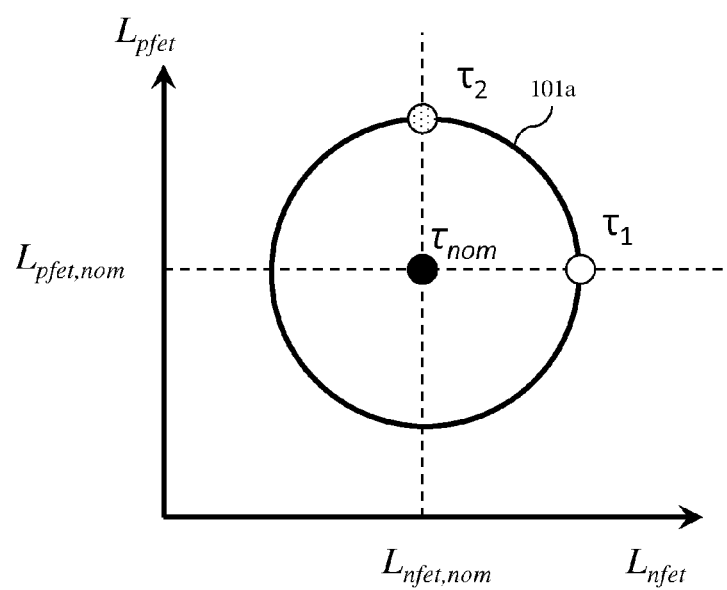
FIG. 1A is a nFET channel length ($L_{nfet}$) to pFET channel length ($L_{pfet}$) graph illustrating the accuracy of a prior art corner model when there is an absence of any correlation between the two channel length values.

For example, one technique for generating a FET corner model for such an integrated circuit involves determining a nominal performance value (e.g., a nominal delay value ($\tau_{nom}$)) by running a simulation with the channel lengths of the nFET and pFET set at their nominal model parameter values (i.e., at their nominal channel length values ($L_{nfet,nom}$ and $L_{pfet,nom}$)). A first corner delay value ($\tau_1$) is then determined by running an additional simulation with the pFET channel length set at its nominal channel length value ($L_{pfet,nom}$) and the nFET channel length set at a corner channel length value ($L_{nfet,nom}+\eta\sigma$, where the parameter $\eta$ can be $+1$, $+2$, $+3$, $-1$, $-2$, or $-3$, etc. Then, a second corner delay value ($\tau_2$) is determined by running yet another additional simulation with the nFET channel length set at its nominal channel length value ($L_{nfet,nom}$) and the pFET channel length set at a corresponding corner channel length value ($L_{pfet,nom}+\eta\sigma$) (see FIG. 1A or FIG. 2A). Finally, the following expressions can be used to obtain the variance ($\sigma_{\tau,corner}^2$) and standard deviation ($\sigma_{\tau,corner}$) of the corner delay:

$$\sigma_{\tau,corner}^2 = \frac{1}{\eta^2}[(\tau_1 - \tau_{nom})^2 + (\tau_2 - \tau_{nom})^2]; \qquad (1a)$$

and, $$\sigma_{\tau,corner} = \frac{1}{\eta}[(\tau_1 - \tau_{nom})^2 + (\tau_2 - \tau_{nom})^2]^{\frac{1}{2}}. \qquad (1b)$$

Figure 1B:
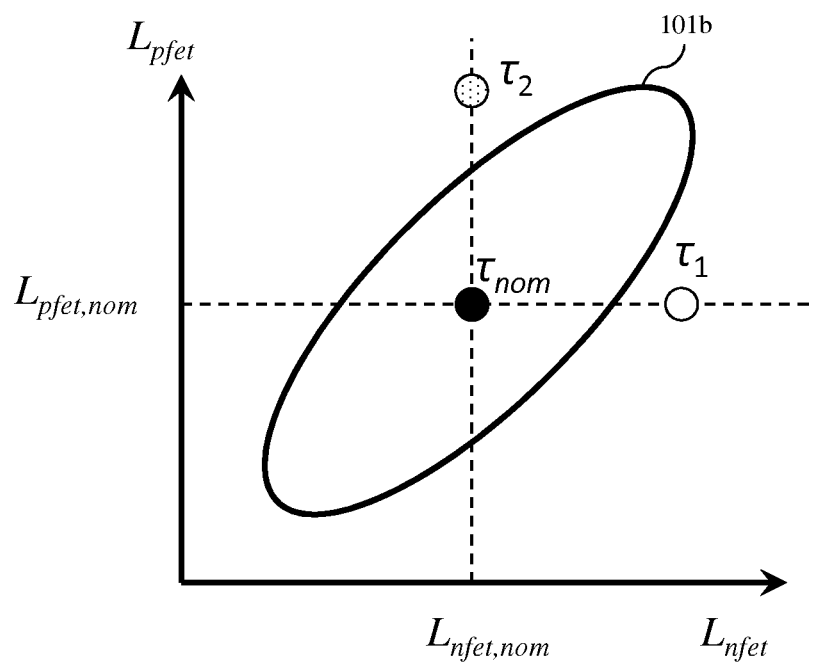
FIG. 1B is another nFET channel length ($L_{nfet}$) to pFET channel length ($L_{pfet}$) graph illustrating the inaccuracy of a prior art corner model when there is a partial correlation between the two channel length values.

Namely, the standard deviation of the corner delay ($\sigma_{\tau,corner}$) is a root sum of squares (RSS) of the differences between corner delays and nominal delay. When there is no correlation between the channel length values of the nFET and pFET (i.e., when the correlation coefficient $C_{nfet,pfet}=0$, as illustrated by the plot of circle 101a in the nFET channel length ($L_{nfet}$) to pFET channel length ($L_{pfet}$) graph of FIG. 1A), this method is accurate. On the other hand, when there is partial correlation between the channel length values of the nFET and pFET (i.e., when correlation coefficient $C_{nfet,pfet}\neq 0$, as illustrated by the plot of ellipse 101b in the nFET channel length ($L_{nfet}$) to pFET channel length ($L_{pfet}$) graph of FIG. 1B), this technique generates results that do not preserve that partial correlation between the channel length values of the nFET and pFET such that the standard deviation determined using Eq. (1b) is inaccurate. This will be explained in the following.

A well-known technique for generating an accurate FET corner model for such an integrated circuit is to generate statistical models and use the statistical models to run Monte Carlo simulations. For example, for a pair of FET models, the channel length values of the nFET and pFET can be partially correlated as illustrated by the following set of statistical models generated for channel lengths:

$$L_{nfet}=L_{nfet,nom}+\sigma(\alpha_{11}g_1+\alpha_{12}g_2)=L_{nfet,nom}+\sigma(a_1g_1+a_2g_2), \qquad (2a)$$

$$L_{pfet}=L_{pfet,nom}+\sigma(\alpha_{21}g_1+\alpha_{22}g_2)=L_{pfet,nom}+\sigma(a_1g_1-a_2g_2), \qquad (2b)$$

with $$a_2=\pm\sqrt{1-a_1^2}, \qquad (3)$$

where each of $g_1$ and $g_2$ is an independent random variable of mean zero and standard deviation one, namely, $$\langle g_1 \rangle = \langle g_2 \rangle = 0, \langle g_1^2 \rangle = \langle g_2^2 \rangle = 1, \langle g_1 g_2 \rangle = 0.$$

The value of the coefficient $a_1$ in the set of statistical models for channel lengths (2a)-(2b) varies with the correlation coefficient ($C_{nfet,pfet}$), which can be expressed as follows:

$$a_1^2 - a_2^2 = 2a_1^2 - 1 = C_{nfet,pfet}, \qquad (4)$$

and which can be simplified as follows:

$$a_1 = \pm\sqrt{(1+C_{nfet,pfet})/2}, \qquad (5)$$

Thus, for example, to achieve a $C_{nfet,pfet}=0.28$, the following must be true: $a_1=0.8$ and $a_2=0.6$. Assume the existence of a set of statistical models for the integrated circuit with all parameters and coefficients already known, the task is then finding a corner model given the set of statistical models.

Inverter delay is a function of two channel lengths. In the linear approximation (which holds when variations are small), the delay ($\tau$) varies linearly with the variations of two channel lengths, $$\tau = f(L_{nfet}, L_{pfet}) \approx \tau_{nom} + s_1 \Delta L_{nfet} + s_2 \Delta L_{pfet}, \qquad (6)$$

where $s_1$ ($s_2$) is the sensitivity of the performance target (inverter delay here) with respect to the variation in nFET (pFET) channel length. The standard deviation of the performance target from Monte Carlo simulation can be obtained analytically in the following linear approximation, $$\sigma_{\tau,MC}^2 = \langle (\tau - \tau_{nom})^2 \rangle = \langle (s_1 \Delta L_{nfet} + s_2 \Delta L_{pfet})^2 \rangle = \sigma^2(s_1^2 + s_2^2 + 2s_1 s_2 C_{nfet,pfet}). \qquad (7)$$

While the Monte-Carlo technique does provide an accurate standard deviation for the delay, it requires hundreds, thousands or tens of thousands of runs of simulations, which is both time consuming and CPU costly. Thus, there is a need to find a quick approach to obtain the standard deviation of the performance target. The corner/sensitivity method is such a method. The commonly used corner approach, however, does not produce the correct standard deviation of a performance target when there are partial correlations among the statistical model parameters of devices used. We will explain this in the following paragraphs.

Prior-art corner/sensitivity methods typically proceed as follows. A nominal delay value ($\tau_{nom}$) is first determined by running a simulation with the channel lengths of both nFET and pFET set at their nominal values (i.e., at their nominal channel length values ($L_{nfet,nom}$ and $L_{pfet,nom}$)). Then, in a first additional simulation run, a first corner delay value ($\tau_1$) is determined by setting pFET channel length at its nominal value ($L_{pfet,nom}$) but offsetting nFET channel length by a few standard deviation ($\eta\sigma$), i.e., $\Delta L_{nfet,1}=\eta\sigma$ and $\Delta L_{pfet,1}=0$. In the linear approximation, the first corner delay value ($\tau_1$) is given by Eq. (6), $$\tau_1 = \tau_{nom} + s_1 \Delta L_{nfet,1} + s_2 \Delta L_{pfet,1} = \tau_{nom} + s_1 \eta\sigma. \qquad (8)$$

In a second additional simulation run, a second corner delay value ($\tau_2$) is determined by setting nFET channel length value at its nominal channel length value ($L_{nfet,nom}$) but offsetting the pFET channel length value by a standard deviation ($\sigma$), i.e., $\Delta L_{nfet,2}=0$ and $\Delta L_{pfet,2}=\eta\sigma$. In the linear approximation, the second corner delay value ($\tau_2$) is also given by Eq. (6), $$\tau_2 = \tau_{nom} + s_1 \Delta L_{nfet,2} + s_2 \Delta L_{pfet,2} = \tau_{nom} + s_2 \eta\sigma. \qquad (9)$$

In this case, the variance of the delay ($\sigma_\tau^2$) and the standard deviation of the delay ($\sigma_\tau$) are determined by Eqs. (1a) and (1b), respectively. In the linear approximation that follows, the value of the variance of the delay is obtained after using Eqs. (8) and (9), $$\sigma_{\tau,corner}^2 = \sigma^2(s_1^2 + s_2^2), \qquad (10)$$

which does not agree with Monte Carlo simulation result (7) in the linear region in that it lacks the partial correlation term, $2s_1s_2C_{nfet,pfet}$, and, thus, is not correct. Referring to the graph of FIG. 1B, the inaccuracy of the prior art corner/sensitivity methods is illustrated by the fact that there is no correlation between the offset of NFET channel length value ($L_{nfet}$) and the offset of PFET channel length value ($L_{pfet}$), since $(\Delta L_{nfet,1})(\Delta L_{pfet,1})=0$ and $(\Delta L_{nfet,2})(\Delta L_{pfet,2})=0$.

In view of the foregoing, disclosed herein are a system, method and computer program product for generating a field effect transistor (FET) corner model for a performance target (e.g., delay) that accurately preserves partial correlations between corresponding statistical model parameters (e.g., channel lengths, threshold voltages, overlap capacitances, channel widths, etc.) of different types of field effect transistors within an integrated circuit. To accomplish this, an initial simulation run is performed to determine a nominal performance value (e.g., a nominal delay value) with all statistical model parameters of the field effect transistors set at their nominal model parameter values (e.g., nominal channel length values, nominal threshold voltage values, nominal overlap capacitance values, nominal channel width values, etc.). Then, multiple additional simulation runs are performed to determine corner performance values (e.g., corner delay values). In each successive additional simulation run, the statistical model parameters of the different types of field effect transistors are properly set at different model parameters values (e.g., different channel length values, different threshold voltage values, different overlap capacitance values, different channel width values, etc.) that are offset from their nominal model parameter values in correlated ways. Then, based on performance differences between each of the corner performance values and the nominal performance value, a standard deviation for the performance target is determined. This technique preserves the partial correlations between the statistical model parameters of the different types of field effect transistors and does so without requiring the performance of a large number of simulations and without requiring knowledge of the sensitivities of the performance target.

Figure 2:
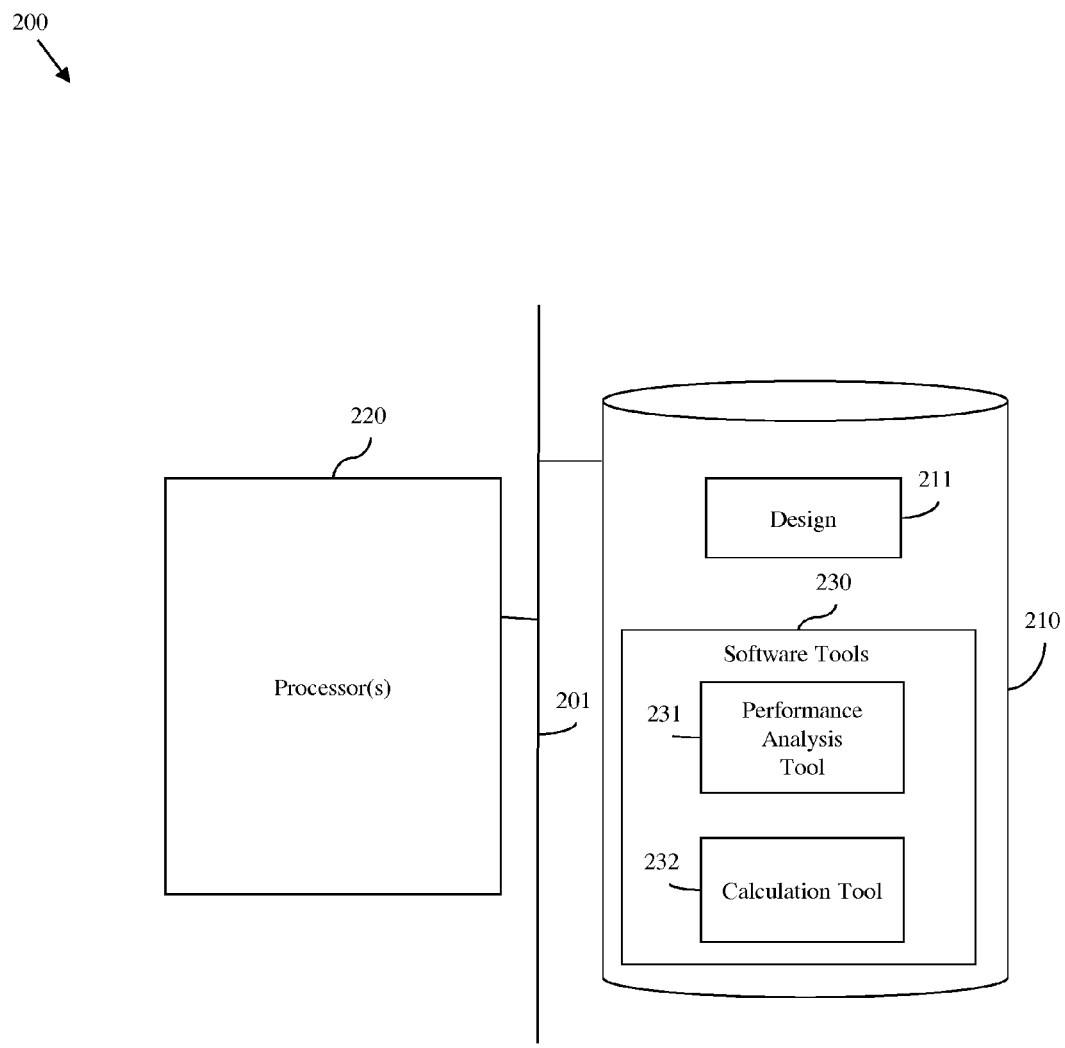
FIG. 2 is a schematic diagram illustrating a computer system for modeling integrated circuit performance and, particularly, for generating a field effect transistor (FET) corner model.

More particularly, referring to FIG. 2, disclosed herein is a computer system 200 for modeling integrated circuit performance. This computer system 200 can be implemented, for example, in a computer hardware environment such as that described in detail below and depicted in FIG. 3. Alternatively, this computer system 200 can be implemented on any other computerized device or network of devices having the required data storage and processing capability to perform the described processes (e.g., a distributed computer system of multiple autonomous computers that communicate through a computer network, a laptop computer, a tablet computer, etc.).

In any case, this computer system 200 can comprise one or more memory devices 210 (e.g., data storage devices) and one or more processors 220 in communication with the memory device(s) 210 (e.g., over a system bus 201 or over any wired or wireless communication network).

The memory device(s) 210 can store information including, but not limited to, a design 211 of an integrated circuit. This integrated circuit can comprise at least two different types of field effect transistors. For example, the integrated circuit can comprise any two or more of the following: a low threshold voltage n-type field effect transistor (LVT nFET), a low threshold voltage p-type field effect transistor (LVT pFET), a regular threshold voltage n-type field effect transistor (RVT nFET), a regular threshold voltage p-type field effect transistor (RVT pFET), a high threshold voltage n-type field effect transistor (HVT nFET), a high threshold voltage p-type field effect transistor (HVT pFET), etc.

The memory device(s) 210 can further store a variety of software tools 230 comprising programs of instructions executable by the processor(s) 220 for performing various different functions. These software tools 230 can include, but are not limited to, a performance analysis tool 231 (e.g., a statistical static timing analysis (SSTA) tool) and a calculation tool 232.

The processor(s) 220 can access the memory device(s) 210 and, particularly, the information stored therein including, the design 211 and the software tools 230, and using this information can generate a corner model for a performance target that preserves partial correlations between corresponding statistical model parameters of each of the different types of field effect transistors. The performance target can comprise, for example, delay of logic gates. The corresponding statistical model parameters can comprise, for example, channel lengths, threshold voltage, overlap capacitances or channel widths. It should be understood that a single processor can execute the software tools 230 in order to generate the corner model, as described. Alternatively, any number of two or more different processors can execute the software tools 230 in order to generate the corner model, as described.

In order to generate such a corner model, the processor(s) 220 can execute the performance analysis tool 231. This performance analysis tool 231 can perform (i.e., can be adapted to perform, can be programmed to perform, etc.) an initial simulation run to determine a nominal performance value. During the initial simulation run, the values of the corresponding statistical model parameters (e.g., the corresponding channel length values, the corresponding threshold voltage values, the corresponding overlap capacitance values or corresponding channel width values) of the two or more different types of field effect transistors can be set at their respective nominal model parameter values (e.g., nominal channel length values, nominal threshold voltage values, nominal overlap capacitance values, or nominal channel width values, respectively).

The performance analysis tool 231 can further perform multiple additional simulation runs to determine corner performance values. During each successive additional simulation run, the values of the corresponding statistical model parameters (e.g., the corresponding channel length values, the corresponding threshold voltage values, the corresponding overlap capacitance values or the corresponding channel width values) of the two or more different types of field effect transistors can be set at different model parameter values that are offset from their respective nominal model parameters values. The different model parameter values used for each successive additional simulation run are chosen in such a way that all given partial correlations among the corresponding statistical model parameters are preserved after all of the additional simulation runs are performed. For example, they can be chosen, as discussed in greater detail below, based on a set of statistical models generated for the statistical model parameters and different types of field effect transistors at issue. Techniques for generating statistical models (e.g., statistical models for channel lengths or other parameters) are well known in the art and those skilled in the art will recognize that such statistical models are typically generated prior to running Monte Carlo simulations. Thus, the details of statistical model generation are omitted from this specification in order to allow the reader to focus on the salient aspects of the disclosed embodiments.

Once the initial and additional simulation runs are preformed, the processor(s) 220 can execute the calculation tool 232. This calculation tool 232 can determine (i.e., can be adapted to determine, can be programmed to determine, etc.) statistical information related to the performance target ($\tau$) (e.g., related to delay of the logic gates). This statistical information can include, but is not limited to, a variance ($\sigma^2$) and/or a standard deviation ($\sigma$) for the performance target, based on performance differences between each of the corner performance values and the nominal performance value. For example, the calculation tool 232 can determine the standard deviation ($\sigma$) for the performance target by solving a root sum of squares (RSS) expression for each of the corner performance values and the nominal performance value. This technique can be used to acquire the same variance ($\sigma^2$) and/or standard deviation ($\sigma$) for the performance target as would be acquired using the Monte-Carlo technique described above. However, this technique has the added advantages of not requiring the performance of hundreds, thousands or tens of thousands of simulations and not requiring knowledge of the sensitivities of the performance target.

Figure 4:
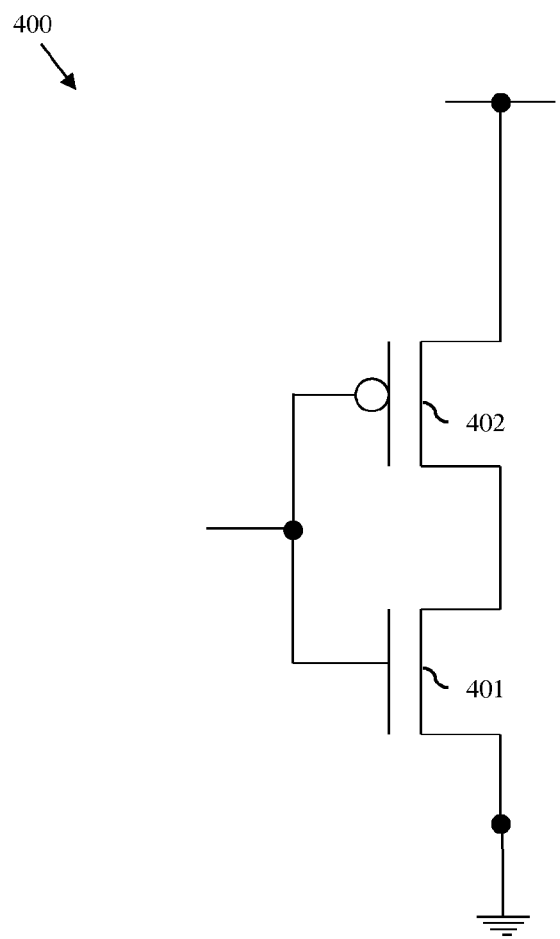
FIG. 4 is a schematic diagram illustrating an exemplary complementary metal oxide semiconductor (CMOS) inverter for which a corner model can be generating using the systems, methods and computer program products disclosed herein.

For illustration purposes, the operation of the computer system 200 of FIG. 2 is described in more detail below with respect to an integrated circuit that comprises a simple complementary metal oxide semiconductor (CMOS) inverter 400, as shown in FIG. 4, with a first field effect transistor (e.g., an n-type field effect transistor (nFET) 401) electrically connected in series to a second field effect transistor (e.g., a p-type field effect transistor (pFET) 402). The performance target at issue can comprise delay ($\tau$) of logic gates and the corresponding statistical model parameters at issue with partial correlations can comprise channel length values ($L_{nfet}$ and $L_{pfet}$) for the nFET 401 and pFET 402, respectively. It should be understood that this description of the operation of the computer system 200 is not intended to be limiting. As mentioned above, the integrated circuit could comprise any number of two or more field effect transistors having corresponding statistical model parameters with partial correlations. Furthermore, the corresponding statistical model parameters at issue could comprise any other model parameters (e.g., threshold voltages (Vt), overlap capacitances, channel widths, etc.).

In this case, the performance analysis tool 231 can comprise, for example, a statistical static timing analysis (SSTA) tool. The SSTA tool 231 can perform (i.e., can be adapted to perform, can be programmed to perform, etc.) an initial simulation run to determine a nominal delay value ($\tau_{nom}$). During the initial simulation run, the corresponding statistical model parameter values and, particularly, the corresponding channel length values of the nFET 401 and pFET 402 can be set at their respective nominal channel length values ($L_{nfet,nom}$ and $L_{pfet,nom}$), as indicated by the design 211.

The SSTA tool 231 can further perform multiple additional simulation runs to determine corner delay values ($\tau_1$ and $\tau_2$). During each successive additional simulation run, the corresponding channel length values of the nFET 401 and pFET 402 can be set at different channel length values ($L_{nfet}$ and $L_{pfet}$, respectively) that are both offset from their respective nominal channel length values ($L_{nfet,nom}$ and $L_{pfet,nom}$) in correlated ways. The channel length values ($L_{nfet}$ and $L_{pfet}$, respectively) used for each successive additional simulation run are chosen in such a way that all given partial correlations among the channel lengths are preserved after all of the additional simulation runs are performed. For example, they can be chosen, as discussed in greater detail below, based on a set of statistical models generated for the channel length values ($L_{nfet}$ and $L_{pfet}$) of the nFET and pFET, respectively. As mentioned above, techniques for generating statistical models (e.g., statistical models for channel lengths or other parameters) are well known in the art and those skilled in the art will recognize that such statistical models are typically generated prior to running Monte Carlo simulations. Thus, the details of statistical model generation are omitted from this specification in order to allow the reader to focus on the salient aspects of the disclosed embodiments.

Thus, in an IC comprising two different types of field effect transistors, each successive additional simulation run can comprise setting a first predetermined statistical model parameter value for the first field effect transistor equal to a first nominal model parameter value for that first field effect transistor plus a first specific multiple of a standard deviation and setting a second predetermined statistical model parameter value for the second field effect transistor equal to a second nominal model parameter value for that second field effect transistor plus a second specific multiple of the standard deviation, where the first and second specific multiples comprise multiples associated with random variables representative of partial correlations within a set of statistical models provided for the IC. More specifically, in the example of the simple CMOS inverter 400 discussed above, each successive additional simulation run can comprise setting a first predetermined channel length value ($L_{nfet}$) for the first field effect transistor (i.e., for the nFET 401) and a second predetermined channel length value ($L_{pfet}$) for the second field effect transistor (i.e., for the pFET 402). In a first additional simulation run, this first predetermined channel length value ($L_{nfet}$) can be set such that it is equal to a first nominal channel length value for the nFET 401 ($L_{nfet,nom}$) plus an nFET's offset multiplier times a standard deviation (i.e., $\eta\alpha_{11}\sigma = \eta a_1 \sigma$) for the first random number $g_1$ in the given statistical model of the FET channel lengths. In the first additional simulation run, the second predetermined channel length value ($L_{pfet}$) can be set such that it is equal to a second nominal channel length value for the pFET 402 ($L_{pfet,nom}$) plus a pFET's offset multiplier times a standard deviation (i.e., $\eta\alpha_{21}\sigma = \eta a_1 \sigma$) of the first random number $g_1$ in the given statistical model of the FET channel lengths. The results of the first additional simulation run can be used to obtain a first corner delay value $\tau_1$. In a second additional simulation run, the first predetermined channel length value ($L_{nfet}$) can be set such that it is equal to a first nominal channel length value for the nFET 401 ($L_{nfet,nom}$) plus an nFET's offset multiplier times a standard deviation (i.e., $\eta\alpha_{12}\sigma = \eta a_2 \sigma$) of the second random number $g_2$ in the given statistical model of the FET channel lengths. In this second additional simulation run, the second predetermined channel length value ($L_{pfet}$) can be set such that it is equal to a second nominal channel length value for the pFET 402 ($L_{pfet}$ plus a pFET's offset multiplier times a standard deviation (i.e., $\eta\alpha_{22}\sigma = -\eta a_2 \sigma$) of the second random number $g_2$ in the given statistical model of the FET channel lengths. The results of this second additional simulation run can be used to obtain a second corner delay value $\tau_2$.

It should be noted that the value of each of the offset multipliers $\eta\alpha_{i,j}$ (also referred to herein as offset coefficients) can be acquired from a set of statistical models, such as those shown in Eqs. (2a)-(2b), which is provided at the start of the disclosed corner model generation process and which illustrates the partial correlation between the corresponding statistical model parameters (e.g., between the channel length values ($L_{nfet}$ and $L_{pfet}$)). For example, for a simple CMOS inverter, the offset multipliers $\alpha_{i,j}$ can be acquired from a set of statistical model for channel length values ($L_{nfet}$ and $L_{pfet}$) and can be, for example: $\eta\alpha_{11} = \eta a_1$ (e.g., 0.8$\eta$) and $\eta\alpha_{12} = \eta a_2$ (e.g., 0.6$\eta$), respectively for the nFET and $\eta\alpha_{21} = \eta a_1$ (e.g., 0.8$\eta$) and $\eta\alpha_{22} = -\eta a_2$ (e.g., −0.6$\eta$), respectively for the pFET). It should be understood that the exemplary offset multipliers provided above are for illustration purposes only and that, depending upon the particular statistical models provided, these offset multiplier will vary but, in any case, will be between −3 and 3.

In this case, in a first additional simulation run, each of the first (nFET) channel length value ($L_{nfet}$) of the nFET 401 and the second (pFET) channel length value ($L_{pfet}$) of the pFET 402 can be offset along $g_1$ direction. Specifically, $L_{nfet}$ and $L_{pfet}$ can be offset from their respective nominal channel length values ($L_{nfet,nom}$ and $L_{pfet,nom}$) by the multiplier for the first random variable $g_1$ in the set of statistical models for channel lengths (2a)-(2b):

$$L_{nfet,1} = L_{nfet,nom} + a_1 \eta \sigma, \quad (11a)$$

$$L_{pfet,1} = L_{pfet,nom} + a_1 \eta \sigma, \quad (11b)$$

where the parameter $\eta$ can be +1, +2, +3, −1, −2, or −3, etc. Based on the results of the first additional simulation run, a first corner delay value ($\tau_1$) can be obtained. Specifically, in the linear approximation, the first corner delay value ($\tau_1$) can be determined using the following expression, where Eqs. (11a) and (11b) are substituted into Eq. (6):

$$\tau_1 + \tau_{nom} + s_1 a_1 \eta \sigma + s_2 a_1 \eta \sigma = \tau_{nom} + a_1 \eta \sigma (s_1 + s_2). \quad (12)$$

Similarly, in a second additional simulation run, each of the first (nFET) channel length value ($L_{nfet}$) of the nFET 401 and the second (pFET) channel length value ($L_{pfet}$) of the pFET 402 can be offset along $g_2$ direction. Specifically, $L_{nfet}$ and $L_{pfet}$ can be offset from their respective nominal values ($L_{nfet,nom}$ and $L_{pfet,nom}$) by the multiplier for the second random variable $g_2$ in the set of statistical models for channel lengths (2a)-(2b):

$$L_{nfet,2} = L_{nfet,nom} + a_2 \eta \sigma, \quad (13a)$$

$$L_{pfet,2} = L_{pfet,nom} - a_2 \eta \sigma. \quad (13b)$$

Based on the results of the second additional simulation run, a second corner delay value ($\tau_2$) can be obtained. Specifically, in the linear approximation, the second corner delay value ($\tau_2$) can be determined using the following expression, wherein Eqs. (13a) and (13b) are substituted into Eq. (6):

$$\tau_2 = \tau_{nom} + s_1 a_2 \eta \sigma - s_2 a_2 \eta \sigma = \tau_{nom} + a_2 \eta \sigma (s_1 s_2). \quad (14)$$

Once the initial and additional simulation runs are preformed as described above, the processor(s) 220 can execute the calculation tool 232. This calculation tool 232 can determine (i.e., can be adapted to determine, can be programmed to determine, etc.) a variance for the delay at the corners ($\sigma_{\tau,corner}^2$) and, thereby the standard deviation for the delay value ($\sigma_{\tau,corner}$) based on performance differences between each of the corner performance values and the nominal performance value. For example, the calculation tool 232 can determine the variance ($\sigma_{\tau,corner}^2$) and, thereby the standard deviation ($\sigma_\tau$) by calculating a root sum of squares (RSS) expression for each of the corner delay values ($\tau_1$ and $\tau_2$) and the nominal delay value ($\tau_{nom}$). Specifically, the variance ($\sigma_{\tau,corner}^2$) can be obtained from Eq. (1a).

This approach to generating a corner model has merit for the following reasons. The variances of $L_{nfet}$ and $L_{pfet}$ are preserved after (2+1) runs. Similar to Eq. (1a), the variance of $L_{nfet}$ in the corner approach and the variance of $L_{pfet}$ in the corner approach are preserved, as follows:

$$\sigma_{nfet,corner}^2 = \frac{1}{\eta^2}[(L_{nfet,1} - L_{nfet,nom})^2 + (L_{nfet,1} - L_{nfet,nom})^2] = \quad (15a)$$

$$\sigma^2(a_1^2 + a_2^2) = \sigma^2,$$

and $$\sigma_{pfet,corner}^2 = \quad (15b)$$

$$\frac{1}{\eta^2}[(L_{pfet,1} - L_{pfet,nom})^2 + (L_{pfet,2} - L_{pfet,nom})^2] = \sigma^2(a_1^2 + a_2^2) = \sigma^2.$$

Additionally, the correlation coefficient is also preserved after (2+1) runs. Similar to Eq. (1a), the correlation coefficient between $L_{nfet}$ and $L_{pfet}$ in the corner approach is $$C_{nfet,pfet}^{corner} = \frac{1}{\eta^2 \sigma^2} \sum_{m=1}^{2} (L_{nfet,m} - L_{nfet,nom})(L_{pfet,m} - L_{pfet,nom}) = \quad (16)$$

$$a_1^2 - a_2^2 = C_{nfet,pfet}.$$

Figure 5:
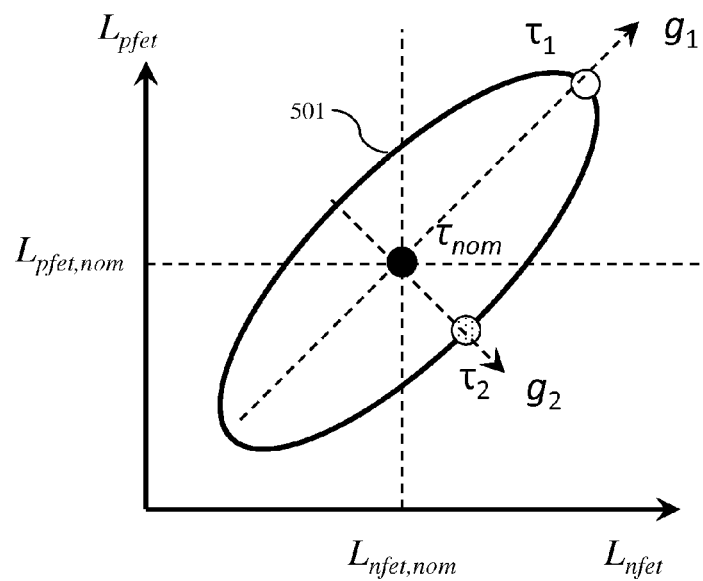
FIG. 5 is a nFET channel length ($L_{nfet}$) to pFET channel length ($L_{pfet}$) graph illustrating the accuracy of the disclosed corner model generation technique when there is a partial correlation between the two channel length values.

Furthermore, in the linear approximation, the relation between the variance ($\sigma_{\tau,corner}^2$) of the delay at the corners and the sensitivities are obtained by substituting Eqs. (11a), (11b), (13a), and (13b) into Eq. (1a) and using Eq. (4), $$\sigma_{\tau,corner}^2 = a_1^2 \sigma^2 (s_1 + s_2)^2 + a_2^2 \sigma^2 (s_1 - s_2)^2 = \sigma^2 [s_1^2 + s_2^2 + 2(a_1^2 - a_2^2)s_1 s_2] = \sigma^2 (s_1^2 + s_2^2 + 2 s_1 s_2 C_{nfet,pfet}), \quad (17)$$

which equals the variance expression of Eq. (7) from the Monte Carlo approach. Since the variance expression of Eq. (17) includes the third sensitivity term of $2 s_1 s_2 C_{nfet,pfet}$ as seen in the Monte-Carlo variance expression of Eq. (7) shown above, this technique does accurately preserve the partial correlation between the model parameters of the nFET and pFET (as illustrated by the fact that in the graph of FIG. 5 delay values ($\tau_1$) and ($\tau_2$) land on the curve 501, which represents the partial correlation), and thereby accurately calculates the standard deviation for delay ($\sigma_\tau$).

It should be noted that in the example of the simple CMOS inverter provided above the total number M of additional simulation runs is equal to the total number N of corresponding statistical model parameters, which is equal to the total number K of different types of FETs. Specifically, in this simple CMOS inverter example, where only a single statistical model parameter (e.g., a channel length, a threshold voltage, an overlap capacitance, or a channel width) of each of the two different types of FETs in an IC is considered, the total number N of corresponding statistical model parameters is equal to the total number K of different types of FETs (i.e., one statistical model parameter and, particularly, the channel length of each of the two different types of FETs). However, when multiple and, particularly, some number J of different types of statistical model parameters (e.g., any two or more of channel length, threshold voltage, overlap capacitance, channel width, etc.) of each of the different types of FETs in an IC are to be considered, the total number N of corresponding statistical model parameters and, thereby the total number M of additional simulation runs required can be greater than the total number K of different types of FETs and, particularly, can be equal to the product of J (i.e., the total number of different types of statistical model parameters of each different type of FET to be considered) and K (i.e., the total number of different types of FETs). Thus, for example, to determine the delay of a simple CMOS inverter considering two different types of statistical model parameters (e.g., both channel length and threshold voltage), the total number N of corresponding statistical model parameters at issue and, thereby the total number M of multiple additional simulation runs will be equal to JK=2×2=4.

It should be understood that operation of the computer system 200 can be essentially the same for an exemplary integrated circuit that comprises more than two different types of field effect transistors (e.g., four different types of field effect transistors including a low threshold voltage n-type field effect transistor (LVT nFET), a low threshold voltage p-type field effect transistor (LVT pFET), a regular threshold voltage n-type field effect transistor (RVT nFET), and a regular threshold voltage p-type field effect transistor (RVT pFET)). In this case, if only one statistical model parameter (e.g., channel length) is to be considered (i.e., if J=1) and the number of different types of FETs is four (i.e., K=4), then the total number N of corresponding statistical model parameters will be equal to four (i.e., N=JK=1×4=4) and the total number M of additional simulation runs required will also be equal to four. In this case, if two statistical model parameters (e.g., channel length and threshold voltage) are to be considered (i.e., if J=2) and the number of different types of FETs is four (i.e., K=4), then the total number N of corresponding statistical model parameters will be equal to eight (i.e., N=JK=2×4=4) and the total number M of additional simulation runs required will also be equal to four.

For example, FIG. 6 is a correlation matrix illustrating exemplary partial correlations that may exist between the channel lengths of four different types of field effect transistors in an integrated circuit. Additionally, Eqs. (18a)-(18d) below illustrate an exemplary set of four statistical models for the channel lengths of the four different types of field effect transistors:

$$L_{lvtn}=L_{lvtn,nom}+\sigma(\sqrt{46}g_1+\sqrt{14}g_2+2g_3)/8, \quad (18a)$$

$$L_{rvtn}=L_{rvtn,nom}+\sigma(\sqrt{46}g_1+\sqrt{14}g_2+2g_3)/8, \quad (18b)$$

$$L_{lvtp}=L_{lvtp,nom}+\sigma(\sqrt{46}g_1+\sqrt{14}g_2+2g_4)/8, \quad (18c)$$

$$L_{rvtp}=L_{rvtp,nom}+\sigma(\sqrt{46}g_1+\sqrt{14}g_2+2g_4)/8, \quad (18d)$$

where each of $g_m$ (m=1, 2, 3, 4) is an independent random variable of mean zero and standard deviation one (M=4 in this example), $$\langle g_m \rangle = 0, m=1,2,\ldots,M;$$

$$\langle g_m^2 \rangle = 1, m=1,2,\ldots,M;$$

$$\langle g_m g_n \rangle = 0, m,n=1,2,\ldots,M, m\neq n. \quad (19)$$

In this case, the initial simulation run can be performed with the channel lengths of each of the four different types of field effect transistors (i.e., $L_{lvtn}$, $L_{rvtn}$, $L_{lvtp}$, and $L_{rvtp}$) set to their nominal channel lengths (i.e., $L_{lvtn,nom}$, $L_{rvtn,nom}$, $L_{lvtp,nom}$, and $L_{rvtp,nom}$) to determine a nominal delay value ($\tau_{nom}$). Then, four additional simulation runs can be performed with the channel lengths of each of the four different types of field effect transistors set, as follows, at different channel length values that are offset from their respective nominal channel length values in correlated ways.

For the first additional simulation run, the channel lengths ($L_{lvtn}$, $L_{rvtn}$, $L_{lvtp}$, and $L_{rvtp}$) of each of the four different transistors can be set such that they are offset along the $g_1$ direction. Specifically, each of the channel lengths ($L_{lvtn}$, $L_{rvtn}$, $L_{lvtp}$, and $L_{rvtp}$) can be offset, as follows, from their respective nominal channel length values ($L_{lvtn,nom}$, $L_{rvtn,nom}$, $L_{lvtp,nom}$, and $L_{rvtp,nom}$) by the multiplier for the first random variable $g_1$ in the set of statistical models for channel lengths (18a)-(18d):

$$L_{lvtn,1}=L_{lvtn,nom}+\sqrt{46}\eta\sigma/8, \quad (20a)$$

$$L_{rvtn,1}=L_{rvtn,nom}+\sqrt{46}\eta\sigma/8, \quad (20b)$$

$$L_{lvtp,1}=L_{lvtp,nom}+\sqrt{46}\eta\sigma/8, \quad (20c)$$

$$L_{rvtp,1}=L_{rvtp,nom}+\sqrt{46}\eta\sigma/8, \quad (20d)$$

where the parameter $\eta$ can be +1, +2, +3, −1, −2, or −3, etc. Based on the results of the first additional simulation run, a first corner performance value ($\tau_1$) can be obtained.

For the second additional simulation run, the channel lengths ($L_{lvtn}$, $L_{rvtn}$, $L_{lvtp}$, and $L_{rvtp}$) of each of the four different transistors can be set such that they are offset along the $g_2$ direction. Specifically, each of the channel lengths ($L_{lvtn}$, $L_{rvtn}$, $L_{lvtp}$, and $L_{rvtp}$) can be set, as follows, such that they are offset from their respective nominal channel length values ($L_{lvtn,nom}$, $L_{rvtn,nom}$, $L_{lvtp,nom}$, and $L_{rvtp,nom}$) by the multiplier for the second random variable $g_2$ in the set of statistical models for channel lengths (18a)-(18d):

$$L_{lvtn,2}=L_{lvtn,nom}+\sqrt{14}\eta\sigma/8, \quad (21a)$$

$$L_{rvtn,2}=L_{rvtn,nom}+\sqrt{14}\eta\sigma/8, \quad (21b)$$

$$L_{lvtp,2}=L_{lvtp,nom}-\sqrt{14}\eta\sigma/8, \quad (21c)$$

$$L_{rvtp,2}=L_{rvtp,nom}-\sqrt{14}\eta\sigma/8. \quad (21d)$$

Based on the results of the second additional simulation run, a second corner performance value ($\tau_2$) can be obtained.

For the third additional simulation run, the channel lengths ($L_{lvtn}$, $L_{rvtn}$, $L_{lvtp}$, and $L_{rvtp}$) of each of the four different transistors can be set such that they are offset along $g_3$ direction. Specifically, each of the channel lengths ($L_{lvtn}$, $L_{rvtn}$, $L_{lvtp}$, and $L_{rvtp}$) can be set, as follows, such that they are offset from their respective nominal channel length values ($L_{lvtn,nom}$, $L_{rvtn,nom}$, $L_{lvtp,nom}$, and $L_{rvtp,nom}$) by the multiplier for the third random variable $g_3$ in the set of statistical models for channel lengths (18a)-(18d):

$$L_{lvtn,3}=L_{lvtn,nom}+\eta\sigma/4, \quad (22a)$$

$$L_{rvtn,3}=L_{rvtn,nom}-\eta\sigma/4, \quad (22b)$$

$$L_{lvtp,3}=L_{lvtp,nom}, \quad (22c)$$

$$L_{rvtp,3}=L_{rvtp,nom}. \quad (22d)$$

It should be noted that as illustrated by Eqs. (22c) and (22d), in any given additional simulation run, one or more statistical model parameters may not be offset. However, in all such additional simulation runs, at least one of statistical model parameters must have an offset. Based on the results of the third additional simulation run, a third corner performance value ($\tau_3$) can be obtained.

Finally, for the fourth additional simulation run, the channel lengths ($L_{lvtn}$, $L_{rvtn}$, $L_{lvtp}$, and $L_{rvtp}$) of each of the four different transistors can be set such that they are offset along the $g_4$ direction. Specifically, each of the channel lengths ($L_{lvtn}$, $L_{rvtn}$, $L_{lvtp}$, and $L_{rvtp}$) can be set, as follows, such that they are offset from their respective nominal channel length values ($L_{lvtn,nom}$, $L_{rvtn,nom}$, $L_{lvtp,nom}$, and $L_{rvtp,nom}$) by the multiplier for the fourth random variable $g_4$ in the set of statistical models for channel lengths (18a)-(18d):

$$L_{lvtn,4}=L_{lvtn,nom}, \quad (23a)$$

$$L_{rvtn,4}=L_{rvtn,nom}, \quad (23b)$$

$$L_{lvtp,4}=L_{lvtp,nom}+\eta\sigma/4, \quad (23c)$$

$$L_{rvtp,4}=L_{rvtp,nom}-\eta\sigma/4, \quad (23d)$$

Based on the results of the fourth additional simulation run, a fourth corner performance value ($\tau_4$) can be obtained.

After obtaining the nominal performance value ($\tau_{nom}$) and the four corner performance values ($\tau_1$, $\tau_2$, $\tau_3$, and $\tau_4$), the variance ($\sigma_{\tau,corner}^2$) and, thereby the standard deviation ($\sigma_{\tau,corner}$) of the corner performance target ($\tau$) can be determined using the following expression, which is a generalization of Eq. (1a):

$$\sigma_{\tau,corner}^2 = \frac{1}{\eta^2} \sum_{m=1}^{4} (\tau_m - \tau_{nom})^2. \tag{24}$$

Consider also a set of coupled relations for N statistical model parameters $p_1, p_2, \ldots, p_N$, which is already provided, $$p_i = p_{i,nom} + \sigma_i \sum_{m=1}^{M} \alpha_{i,m} g_m, \ i = 1, 2, \cdots, N, \tag{25}$$

where each of $g_m$ is an independent random variable of mean zero and standard deviation one (see Eq. (19)). Coefficients $\alpha_{i,m}$ satisfy normalization conditions, $$\sum_{m=1}^{M} \alpha_{i,m}^2 = C_{i,i} = 1, \ i = 1, 2, \cdots, N, \tag{26}$$

such that $$\langle (\Delta p_i)^2 \rangle = \langle (p_i - p_{i,nom})^2 \rangle = \sigma_i^2, \ i=1,2,\ldots,N \tag{27}$$

Coefficients $\alpha_{i,m}$ further satisfy the following relations, and correlation relations $$\sum_{m=1}^{M} \alpha_{i,m} \alpha_{j,m} = C_{i,j}, \ i, j = 1, 2, \cdots, N, \tag{28}$$

such that $$\langle (\Delta p_i)(\Delta p_j) \rangle = \langle (p_i - p_{i,nom})(p_j - p_{j,nom}) \rangle = \sigma_i \sigma_j C_{i,j}, \ i,j = 1,2,\ldots,N, \tag{29}$$

where $C_{i,j}$ are correlation coefficients. In this case, the number of independent random variables and, thereby the number M of additional simulation runs required can be equal to, larger than, or smaller than the total number of corresponding statistical model parameters N. Specifically, the statistical model parameters $p_1, p_2, \ldots, p_N$ can be a mix of nFET channel length, pFET channel length, nFET overlap capacitance, pFET overlap capacitance, nFET threshold voltage, pFET threshold voltage, nFET channel width, pFET channel width, etc.

For example, for an RVT inverter comprising an RVT nFET and an RVT pFET where two different types of statistical model parameters, namely, channel length and threshold voltage, are considered, the total number N of corresponding statistical model parameter equals KJ=2×2=4. Given the above statistical model of Eq. (25) above, a corner model can be acquired by first performing an initial simulation run during which each statistical model parameter is set at its respective nominal value, $$p_{i,0} = p_{i,nom}, \ i=1,2,\ldots,N, \tag{30}$$

in order to obtain a nominal performance value $\tau_{nom}$. Then, M additional simulation runs can be performed. During the mth (m=1, 2, ..., M) additional simulation run, the statistical model parameters can be offset along the $g_m$ direction. Specifically, the statistical model parameters can be set as follows:

$$p_{i,m} = p_{i,nom} + \sigma_i(\eta \alpha_{i,m}), \ i=1,2,\ldots,N, \ m=1,2,\ldots,M, \tag{31}$$

a mth additional simulation run can be performed and, based on the results of the mth additional simulation run, a mth corner performance value $\tau_m$ can be obtained as discussed above. Again, the parameter $\eta$ in Eq. (31) can be +1, +2, +3, −1, −2, or −3, etc. The range of the product $\eta \alpha_{i,m}$ is from −|$\eta$| to |$\eta$|. Alternatively, we say that the range of the product $\eta \alpha_{i,m}$ is from −3 to +3.

Finally, after obtaining the nominal performance value $\tau_{nom}$ and the corner performance values at each additional simulation run (i.e., $\tau_1, \tau_2, \ldots, \tau_M$), the following expressions, which are a generalization of Eq. (24), can be used to obtain the variation ($\sigma_{\tau,corner}^2$) of the performance target $\tau$:

$$\sigma_{\tau,corner}^2 = \frac{1}{\eta^2} \sum_{m=1}^{M} (\tau_m - \tau_{nom})^2, \tag{32a}$$

and $$\sigma_{\tau,corner} = \frac{1}{\eta} \left[ \sum_{m=1}^{M} (\tau_m - \tau_{nom})^2 \right]^{\frac{1}{2}}. \tag{32b}$$

Namely, the standard deviation of the corner delay ($\sigma_{\tau,corner}$) is a root sum of squares (RSS) of the differences between corner delays and nominal delay. This approach to generating a corner model has merit for the following reasons. The variances of $p_1, p_2, \ldots, p_N$ are preserved after (M+1) runs. Similar to Eq. (32), the variance of $p_i$ in the corner approach can be solved for as follows:

$$\sigma_{i,corner}^2 = \frac{1}{\eta^2} \sum_{m=1}^{M} (p_{i,m} - p_{i,nom})^2 = \sigma_i^2 \sum_{m=1}^{M} \alpha_{i,m}^2 = \sigma_i^2, \ i = 1, 2, \cdots, N, \tag{33}$$

where Eqs. (31) and (26) have been used. Additionally, N(N−1)/2 correlation coefficients are also preserved after (M+1) runs. Similar to Eqs. (32a) and (33), the correlation coefficient between $p_i$ and $p_j$ in the corner approach can be solved for as follows:

$$C_{i,j}^{corner} = \frac{1}{\eta^2 \sigma_i \sigma_j} \sum_{m=1}^{M} (p_{i,m} - p_{i,nom})(p_{j,m} - p_{j,nom}) = \sum_{m=1}^{M} \alpha_{i,m} \alpha_{j,m} = C_{i,j}, \ i, j = 1, 2, \cdots, N, \tag{34}$$

where Eqs. (31) and (28) have been used. Furthermore, in the linear approximation, the standard deviation obtained from the corner approach is equals to that obtained from the Monte Carlo approach. In the linear approximation, a performance target is a linear function of variations of statistical parameters, as shown below:

$$\tau \approx \tau_{nom} + \sum_{i=1}^{N} s_i(p_i - p_{i,nom}), \quad (35)$$

where $s_i$ (i=1, 2, ..., N) is a sensitivity of the performance target with respect to variation in the ith statistical model parameter and its value is not known. In terms of sensitivities $s_i$, the variance and, thereby the standard deviation of the performance target from Monte Carlo simulations can be obtained analytically as follows:

$$\sigma^2_{\tau,MC} = \langle (\tau - \tau_{nom})^2 \rangle = \left\langle \left( \sum_{i=1}^{N} s_i \sigma_i \sum_{m=1}^{M} \alpha_{i,m}, g_m \right)^2 \right\rangle \quad (36)$$

$$= \left\langle \left( \sum_{i=1}^{N} s_i \sigma_i \sum_{m=1}^{M} \alpha_{i,m}, g_m \right) \left( \sum_{j=1}^{N} s_j \sigma_j \sum_{n=1}^{M} \alpha_{j,n} g_n \right) \right\rangle$$

$$= \left\langle \sum_{i=1}^{N} s_i \sigma_i \sum_{j=1}^{N} s_j \sigma_j \sum_{m,n=1}^{M} \alpha_{i,m} \alpha_{j,n} g_m g_n \right\rangle$$

$$= \sum_{i=1}^{N} s_i \sigma_i \sum_{j=1}^{N} s_j \sigma_j \sum_{m,n=1}^{M} \alpha_{i,m} \alpha_{j,n} \langle g_m g_n \rangle$$

$$= \sum_{i=1}^{N} s_i \sigma_i \sum_{j=1}^{N} s_j \sigma_j \sum_{m=1}^{M} \alpha_{i,m} \alpha_{j,m}$$

$$= \sum_{i=1}^{N} s_i \sigma_i \sum_{j=1}^{N} s_j \sigma_j C_{i,j}.$$

In terms of sensitivities $s_i$, the variance ($\sigma^2_{\tau,corner}$) and, thereby the standard deviation ($\sigma_{\tau,\,corner}$) of the performance target ($\tau$) from our corner approach can also be found analytically by substituting Eqs. (35) and (31) into Eq. (32a) and using Eq. (28), as follows:

$$\sigma^2_{\tau,corner} = \frac{1}{\eta^2} \sum_{m=1}^{M} \sum_{i=1}^{N} s_i(p_i - p_{i,nom}) \sum_{j=1}^{N} s_j(p_j - p_{j,nom}) \quad (37)$$

$$= \sum_{m=1}^{M} \sum_{i=1}^{N} s_i \sigma_i \alpha_{i,m} \sum_{j=1}^{N} s_j \sigma_j \alpha_{j,m}$$

$$= \sum_{i=1}^{N} s_i \sigma_i \sum_{j=1}^{N} s_j \sigma_j \sum_{m=1}^{M} \alpha_{i,m} \alpha_{j,m}$$

$$= \sum_{i=1}^{N} s_i \sigma_i \sum_{j=1}^{N} s_j \sigma_j C_{i,j},$$

which is identical to Eq. (36).

Optionally, operation of the computer system 200 can be such that the total number M of additional simulation runs can be reduced to be equal to a lesser number I of the total number N of corresponding statistical model parameters and, particularly, to only that number I of the N corresponding statistical model parameters that actually affect a given performance target. Specifically, a determination can be made that, although an integrated circuit has a total number K of different types of FETs, only some number L of those K different types of FETs will actually affect the performance target at issue. Thus, the corner model can be generated based on a lesser number I of the N corresponding statistical model parameters, where I is equal to the product of the J (i.e., the total number of different types of statistical model parameters to be considered) and L (i.e., the lesser number of the K different types of FETs that actually affect the performance target). That is, I=JL, when L<K such that I<N. In this case, the total number M of additional simulation runs will be equal to I. However, in order to accomplish this, the full set of statistical models, which couples the N corresponding statistical model parameters together, must be reconstructed into a smaller, reconstructed set of statistical models, which couples together the statistical model parameters of only those L FETs that affect the performance target. Thus, in this reconstructed set, the partial correlations between the statistical model parameters of the L FETs are preserved; however, any correlations between the statistical model parameters of the L FETs and the statistical model parameters of the rest of the FETs (i.e., the FETs that do not affect the performance target) are uncoupled.

For example, an exemplary integrated circuit may comprise four different types of field effect transistors (i.e., K=4) including a low threshold voltage n-type field effect transistor (LVT nFET), a low threshold voltage p-type field effect transistor (LVT pFET), a regular threshold voltage n-type field effect transistor (RVT nFET), and a regular threshold voltage p-type field effect transistor (RVT pFET). Eqs. (18a)-(18d) above illustrate the full set of four statistical models for the four different types of FETs in this integrated circuit, when only a single type of statistical model parameter, namely, channel length, is considered. Typically, in this case, the total number M of additional simulations required for corner model generation would be equal to the total number N of corresponding statistical model parameters, which would be equal to KJ=4×1=4. However, if a determination is made that in this integrated circuit a lesser number L (e.g., only RVT nFET and RVT pFET) of the total number K of the different types of field effect transistors are known to affect the performance target (e.g., delay of an inverter), then the additional simulation runs can be focused only on this pair of transistors, RVT nFET and RVT pFET and the number M of additional simulation runs will be equal to I, which is equal to the product of J and L. However, in order to accomplish this, the full set of four statistical models as shown in Eqs. (18a)-(18d), which couples the four corresponding statistical model parameters and, particularly, the four channel lengths of the four different types of FETs together, must be reconstructed into a smaller, reconstructed set of statistical models as shown in Eqs. (38a)-(38b) below, which couples together the statistical model parameters and, particularly, the channel lengths of only the RVT nFET and RVT pFET that affect the performance target.

Specifically, in this case, FIG. 7 is a correlation matrix illustrating exemplary partial correlations between the channel lengths of only this pair of transistors, RVT nFET and RVT pFET, and not the other transistors, LVT nFET and LVT pFET, within the integrated circuit. In this case, based on the reduced correlation matrix in FIG. 7, the full set of statistical models as shown in Eqs. (18a)-(18d), which couples together the four channel lengths of the four different types of FETs, can be reconstructed into a reconstructed set of statistical models, as shown in Eqs. (38a)-(38b) below, which couples together the channel lengths of only RVT nFET and RVT pFET. In this reconstructed set, the partial correlations between the statistical model parameters and, particularly, the channel lengths of RVT nFET and RVT pFET are preserved; however, any correlations between the statistical model parameters and, particularly, the channel lengths of the LVT nFET and LVT pFET are uncoupled.

$$L_{rvtn}=L_{rvtn,nom}+\sigma(\sqrt{3}g_1+g_2)/2, \quad (38a)$$

$$L_{rvtp}=L_{rvtp,nom}+\sigma(\sqrt{3}g_1-g_2)/2. \quad (38b)$$

After reconstructing the full set of statistical models into the smaller, reconstructed set of statistical models (38a) and (38b), the initial simulation run for the corner model can be performed, as discussed above, to determine a nominal delay value ($\tau_{nom}$). Then, only two additional simulation runs need to be performed with the channel lengths of RVT nFET and RVT pFET set, using the reconstructed set of statistical models of Eqs. (38a) and (38b), at different channel length values that are offset from their respective nominal channel length values in correlated ways.

Specifically, for the first additional simulation run, the channel lengths ($L_{rvtn}$ and $L_{rvtp}$) of only the transistors RVT nFET and RVT pFET can be set such that they are offset along the $g_1$ direction. Specifically, each of the channel lengths $L_{rvtn}$ and $L_{rvtp}$ can be offset from their respective nominal channel length values by the multiplier for the first random variable $g_1$ in the subset of statistical models for channel lengths (38a)-(38b):

$$L_{rvtn,1}=L_{rvtn,nom}+\sqrt{3}\eta\sigma/2, \quad (39a)$$

$$L_{rvtp,1}=L_{rvtp,nom}+\sqrt{3}\eta\sigma/2. \quad (39b)$$

Based on the results of the first additional simulation run, a first corner performance value $\tau_1$ can be obtained.

For a second additional simulation run, the channel lengths ($L_{rvtn}$ and $L_{rvtp}$) of only the transistors RVT nFET and RVT pFET can be set such that they are offset along the $g_2$ direction. Specifically, each of the channel lengths $L_{rvtn}$ and $L_{rvtp}$ can be offset from their respective nominal channel length values by the multiplier for the second random variable $g_2$ in the subset of statistical models for channel lengths (38a)-(38b):

$$L_{rvtn,2}=L_{rvtn,nom}+\eta\sigma/2, \quad (40a)$$

$$L_{pvtn,2}=L_{pvtn,nom}-\eta\sigma/2. \quad (40b)$$

Based on the results of the second additional simulation run, a second corner performance value $\tau_2$ can be obtained. After obtaining nominal performance value ($\tau_{nom}$) and two corner performance values ($\tau_1$ and $\tau_2$), Eqs. (1a)-(1b) can further be used to obtain the variance ($\sigma_{\tau,corner}^2$) and the standard deviation ($\sigma_{\tau,corner}$) of the performance target ($\tau$).

Figure 8:
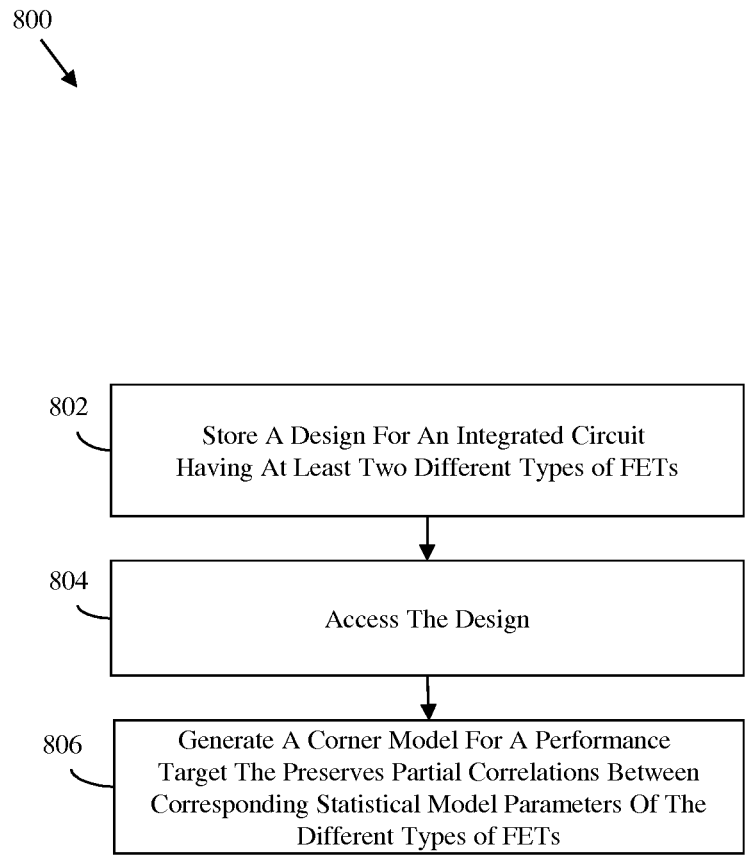
FIG. 8 is a flow diagram illustrating a method for modeling integrated circuit performance and, particularly, for generating a field effect transistor (FET) corner model.

Referring to the flow diagram of FIG. 8 in combination with FIG. 2, also disclosed herein is a computer-implemented method 800 for modeling integrated circuit performance.

This method can comprise storing, in one or more memory devices 210 (e.g., data storage devices), information including, but not limited to, a design 211 of an integrated circuit (802). This integrated circuit can comprise at least two different types of field effect transistors. For example, the integrated circuit can comprise any two or more of the following: a low threshold voltage n-type field effect transistor (LVT nFET), a low threshold voltage p-type field effect transistor (LVT pFET), a regular threshold voltage n-type field effect transistor (RVT nFET), a regular threshold voltage p-type field effect transistor (RVT pFET), a high threshold voltage n-type field effect transistor (HVT nFET), a high threshold voltage p-type field effect transistor (HVT pFET), etc. The method can also comprise storing, in the memory device(s) 210, a variety of software tools 230 comprising programs of instructions executable by the processor(s) 220 for performing various different functions. These software tools 230 can include, but are not limited to, a performance analysis tool 231 (e.g., a statistical static timing analysis (SSTA) tool) and a calculation tool 232.

The method can further comprise accessing, by one or more processor(s) 220 from the memory device(s) 210, information stored therein including, the design 211 and the software tools 230 (804) and using this information can generate a corner model for a performance target that preserves partial correlations between corresponding statistical model parameter values of the different types of field effect transistors (806).

Figure 9:
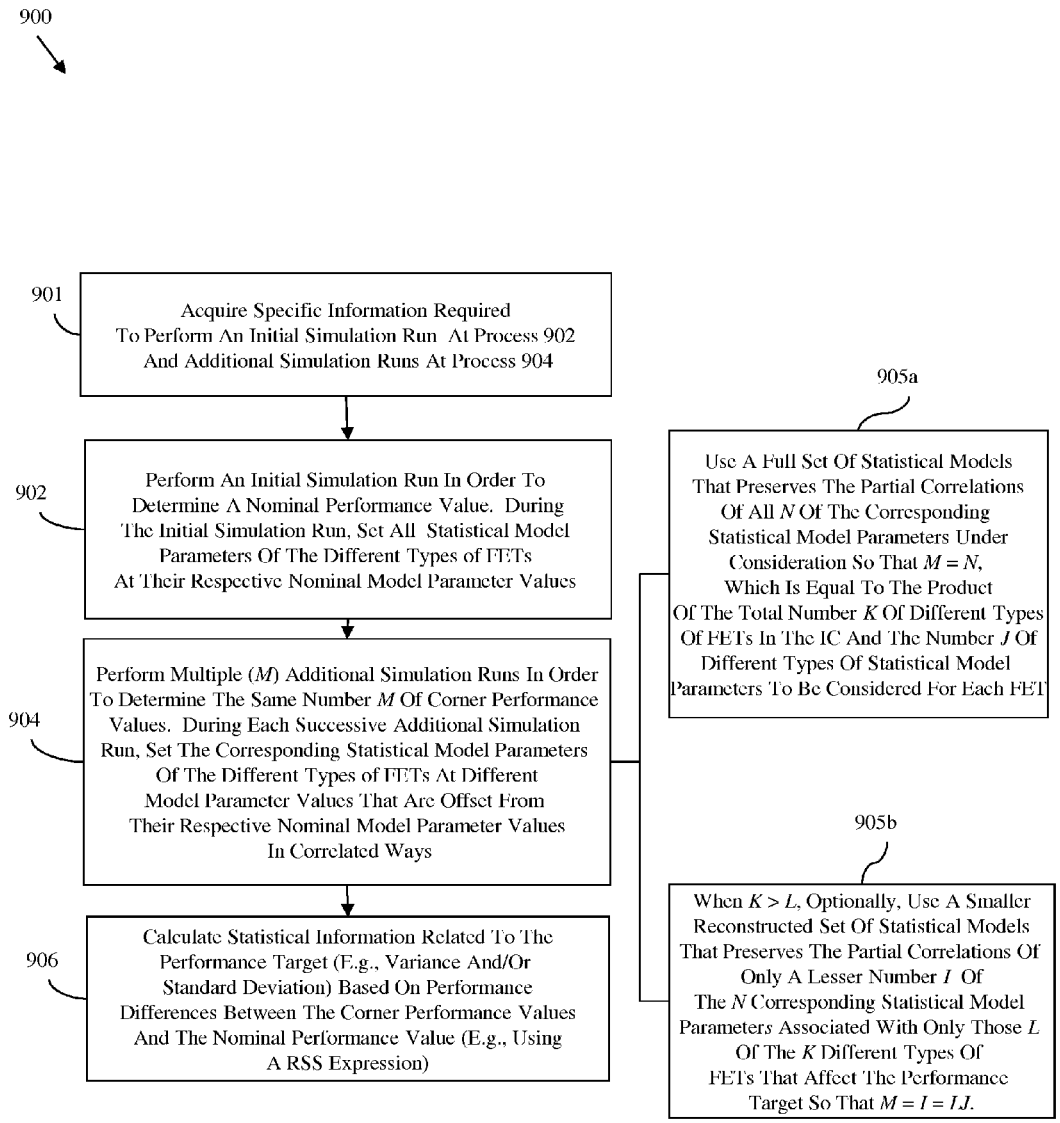
FIG. 9 is a flow diagram illustrating in greater detail the process 806 of FIG. 8.

FIG. 9 is a flow diagram illustrating in greater detail the process 806 of generating a corner model for a performance target that preserves partial correlations between corresponding statistical model parameter values of the different types of field effect transistors. In order to generate such a corner model, setup for simulation runs can be performed. This set up can include, but is not limited to, acquiring specific information required to perform an initial simulation run and multiple additional simulation runs at processes 902-904, described in detail below (901).

This specific information can include, but is not limited to, the following: (1) a performance target ($\tau$) at issue (e.g., delay); (2) the total number K and identity of the different types of field effect transistors used in the integrated circuit at issue, as indicated by the design; (3) optionally, the number L and identity of those of the K different types of field effect transistors that affect the performance target ($\tau$) at issue such that K≥L; (4) the total number J and identity of the different types of statistical model parameters (e.g., channel length, threshold voltage, overlap capacitance, channel width, etc.) in each of the K different types of field effect transistors to be considered; (5) a full set of statistical models that preserves the partial correlations between all N corresponding statistical model parameters at issue, where N=JK; (6) optionally, a reconstructed set of statistical models associated with a lesser number I of the N corresponding statistical model parameters, where I=JL, when K>L, and where the reconstructed set includes statistical models for only those L FETs that affect the performance target, preserves the partial correlations between only the statistical model parameters of those L FETs and uncouples any correlations between the statistical model parameters of the L FETs and the statistical model parameters of the other FETs accounted for in the full set; and (7) the total number M of additional simulation runs to be performed, where M=N or, optionally, where M=I, when K>L and a reconstructed set of statistical models is available.

Then, an initial simulation run can be performed (e.g., by a processor 220 executing a performance analysis tool 231) to determine a nominal performance value ($\tau_{nom}$) (902). During the initial simulation run, the corresponding statistical model parameter values of the two or more different types of field effect transistors can be set at their respective nominal model parameter values, as indicated in the design 211. This initial simulation run can be performed considering all of the N corresponding statistical model parameters for all of the K different types of field effect transistors.

Then, multiple additional simulation runs and, particularly, a predetermined number M of additional simulation runs can be performed (e.g., by a processor 220 executing a performance analysis tool 231) to determine corner performance values (904). During each successive additional simulation run at process 904, the corresponding statistical model parameter values of the two or more different types of field effect transistors can be set at different model parameter values that are offset from their respective nominal model parameters values in correlated ways. The different parameter values used for each successive additional simulation run are chosen in such a way that all given partial correlations among the corresponding statistical model parameters are preserved after all of the additional simulation runs are performed. Specifically, they can be chosen, as discussed in greater detail above with regard to the system 200, based on a set of provided statistical models.

It should be noted that the additional simulation runs can be performed using the full set of statistical models, which preserves the partial correlations between all of the N corresponding statistical model parameters of all of the K different types of field effect transistors, and, thus, so that the total number M of additional simulation runs is equal to the total number N of corresponding statistical model parameters, which, as discussed above, is equal to the product of the number K of different types of FETs and the number J of different types of statistical model parameters considered (i.e., M=N=KJ) (905a).

Alternatively, if the total number K of the different types of FET in an integrated circuit under consideration is greater than the number L of those K different types of field effect transistors whose statistical model parameters actually affect the performance target (τ) at issue (i.e., if K>L), the additional simulation runs can be performed using the smaller reconstructed set of statistical models, which preserves only the partial correlations between the statistical model parameters of those L FETs that affect the performance target, and, thus, the total number M of additional simulation runs is equal to a lesser number I of the N corresponding statistical model parameters, where I=JL, by using only the smaller reconstructed set of statistical models referenced above and, thus, M=I=JL (905b).

Once the initial and additional simulation runs are preformed as described statistical information related to the performance target (τ) can be determined (e.g., by a processor 220 executing a calculation tool 232) (906). This statistical information can include, but is not limited to, a variance ($\sigma_{\tau,corner}^2$) and/or a standard deviation ($\sigma_{\tau,\ corner}$) for the performance target (τ), based on performance differences between each of the corner performance values ($\tau_1, \tau_2, \ldots$) and the nominal performance value ($\tau_{nom}$). For example, the standard deviation ($\sigma_{\tau,\ corner}$) for the performance target can be determined by solving a root sum of squares (RSS) expression for each of the corner performance values and the nominal performance value. This technique can be used to acquire the same variance ($\sigma_{\tau,corner}^2$) and/or standard deviation ($\sigma_{\tau,\ corner}$) for the performance target as would be acquired using the Monte-Carlo technique described above. However, this technique has the added advantages of not requiring the performance of hundreds, thousands or tens of thousands of simulations and not requiring knowledge of the sensitivities of the performance target.

For illustration purposes, process steps 902-906 of FIG. 9 are described in more detail below with respect to an integrated circuit that comprises a simple complementary metal oxide semiconductor (CMOS) inverter 400, as shown in FIG. 4, with a first field effect transistor (e.g., an n-type field effect transistor (nFET) 401) electrically connected in series to a second field effect transistor (e.g., a p-type field effect transistor (pFET) 402). The performance target at issue can comprise delay (τ) and the corresponding statistical model parameters at issue with partial correlations can comprise channel length values ($L_{nfet}$ and $L_{pfet}$) only for the nFET 401 and pFET 402, respectively. It should be understood that this description of the operation of the computer system 200 is not intended to be limiting. As mentioned above, the integrated circuit could comprise any number of two or more different types of field effect transistors having corresponding statistical model parameters with partial correlations. Furthermore, the corresponding statistical model parameter values could comprise any other model parameter values with partial correlations (e.g., threshold voltage values (Vt), overlap capacitance values, channel width values, etc.).

In this case, an initial simulation run can be performed at process 902 (e.g., by a processor 220 executing a performance analysis tool 231 and, particularly, a statistical static timing analysis (SSTA) tool) to determine a nominal delay value ($\tau_{nom}$). During the initial simulation run, the corresponding statistical model parameter values of the nFET 401 and pFET 402 can be set at their respective nominal channel length values ($L_{nfet,nom}$ and $L_{pfet,nom}$), as indicated by the design 211.

Then, multiple additional simulation runs can be performed at process 904 (e.g., by the processor 220 executing the SSTA tool) using a full set of statistical models that preserves the partial correlations between the channel lengths for the nFET 401 and pFET 402 to determine corner delay values ($\tau_1$ and $\tau_2$). During each successive additional simulation run at process 904, the corresponding channel length values of the nFET 401 and pFET 402 can be set at different channel length values ($L_{nfet}$ and $L_{pfet}$, respectively) that are both offset from their respective nominal channel length values ($L_{nfet,nom}$ and $L_{pfet,nom}$) in correlated ways. The channel length values ($L_{nfet}$ and $L_{pfet}$, respectively) used for each successive additional simulation run are chosen in such a way that all given partial correlations among the channel lengths are preserved after all of the additional simulation runs are performed.

Specifically, in this case, in a first additional simulation run, each of the first (nFET) channel length value ($L_{nfet}$) of the nFET 401 and the second (pFET) channel length value ($L_{pfet}$) of the pFET 402 can be offset from their respective nominal channel length values ($L_{nfet,nom}$ and $L_{pfet,nom}$) as shown in Eqs. (11a) and (11b) by the multiplier for the first random variable $g_1$ in the statistical models for channel lengths (2a)-(2b). Based on the results of the first additional simulation run, a first corner delay value ($\tau_1$) can be obtained. Specifically, in the linear approximation, the first corner delay value ($\tau_1$) can be determined using Eq. (12), where Eqs. (11a) and (11b) are substituted into Eq. (6). Similarly, in a second additional simulation run, each of the first (nFET) channel length value ($L_{nfet}$) of the nFET 401 and the second (pFET) channel length value ($L_{pfet}$) of the pFET 402 can be offset from their respective nominal values ($L_{nfet,nom}$ and $L_{pfet,nom}$) as shown in Eqs. (11a) and (11b) by the multiplier for the second random variable $g_2$ in the statistical model for channel lengths (2a)-(2b). Based on the results of the second additional simulation run, a second corner delay value ($\tau_2$) can be obtained. Specifically, in the linear approximation, the second corner delay value ($\tau_2$) can be determined using Eq. (14), where Eqs. (13a) and (13b) are substituted into Eq. (6).

Once the initial and additional simulation runs are preformed at processes 902-904 as described above, a variance for the delay at the corners ($\sigma_{\tau,corner}^2$) and, thereby the standard deviation for the delay value ($\sigma_{\tau,\ corner}$) can be determined (e.g., by a processor 220 executing a calculation tool 232) based on performance differences between each of the corner performance values and the nominal performance value (906). For example, the variance ($\sigma_{\tau,corner}^2$) and, thereby the standard deviation ($\sigma_{\tau,\ corner}$) can be determined by solving a root sum of squares (RSS) expression for each of the corner delay values ($\tau_1$ and $\tau_2$) and the nominal delay value ($\tau_{nom}$) using Eqs. (1a)-(1b).

It should be noted that in the example provided above where the integrated circuit comprises a simple CMOS inverter the additional simulation runs were performed using the full set of statistical models and the total number M of multiple additional simulation runs was equal to two and, particularly, equal to the total number N of corresponding statistical model parameters at issue, which, as discussed above, is equal to the product of the total number K of different field effect transistors (in this case, two) and the number J of different types of statistical model parameters considered for each different type of FET (in this case, one, namely channel length) (905*a*).

Essentially the same method steps can be applied for an exemplary integrated circuit that comprises more than two different types of field effect transistors (e.g., four different types of field effect transistors including a low threshold voltage n-type field effect transistor (LVT nFET), a low threshold voltage p-type field effect transistor (LVT pFET), a regular threshold voltage n-type field effect transistor (RVT nFET), and a regular threshold voltage p-type field effect transistor (RVT pFET)). In this case, the additional simulation runs can be performed using a full set of statistical models that preserves the partial correlations between the channel lengths of the four different types of FETs such that the total number M of multiple additional simulation runs will be equal to four and, particularly, will be equal the total number N of corresponding statistical model parameters at issue, which, as discussed above, is equal to the product of the total number K of different types of field effect transistors (in this case, four) and the number J of different types of statistical model parameters considered for each different type of FET (in this case, one, namely channel length) (905*a*). See detailed discussion above regarding the correlation matrix of FIG. 6 and Eqs. (18a)-(18d) (see also Eqs. (22a)-(23d)).

Alternatively, however, the additional simulation runs can be performed using a smaller, reconstructed set of statistical models that preserves the partial correlation between the statistical model parameters of only those L of the K different types of field effect transistors that affect the performance target such that the total number M of additional simulation runs performed at process 904 can actually be less than the total number N of corresponding statistical model parameters (905*b*). Specifically, prior to performing the initial simulation run at process 904 and the additional simulation runs at process 906, a determination can be made that, although an integrated circuit has a total number K of different types of FETs, only some lesser number L of those K different types of FETs will actually affect the performance target at issue. Thus, the corner model can be generated based on a lesser number I of the N corresponding statistical model parameters, where I is equal to the product of the J (i.e., the total number of different types of statistical model parameters to be considered) and L (i.e., the lesser number of the K different types of FETs that actually affect the performance target). That is, I=JL, when L<K such that I<N. In this case, the total number M of additional simulation runs will be equal to I. However, in order to accomplish this, the full set of statistical models, which couples the N corresponding statistical model parameters together, must be reconstructed into a smaller, reconstructed set of statistical models, which couples together the statistical model parameters of only those L FETs that affect the performance target. Thus, in this reconstructed set, the partial correlations between the statistical model parameters of the L FETs are preserved; however, any correlations between the statistical model parameters of the L FETs and the statistical model parameters of the rest of the FETs (i.e., the FETs that do not affect the performance target) are uncoupled.

For example, an exemplary integrated circuit may comprise four different types of field effect transistors (i.e., K=4) including a low threshold voltage n-type field effect transistor (LVT nFET), a low threshold voltage p-type field effect transistor (LVT pFET), a regular threshold voltage n-type field effect transistor (RVT nFET), and a regular threshold voltage p-type field effect transistor (RVT pFET). Eqs. (18a)-(18d) above illustrate the full set of four statistical models for the four different types of FETs in this integrated circuit, when only a single type of statistical model parameter, namely, channel length, is considered. Typically, in this case, the total number M of additional simulations required for corner model generation would be equal to the total number N of corresponding statistical model parameters, which would be equal to KJ=4×1=4. However, if a determination is made that in this integrated circuit a lesser number L (e.g., only RVT nFET and RVT pFET) of the total number K of the different types of field effect transistors are known to affect the performance target (e.g., delay of an inverter), then the additional simulation runs at process 904 can be focused only on this pair of transistors, RVT nFET and RVT pFET and the number M of additional simulation runs will be equal to I, which is equal to the product of J and L. However, in order to accomplish this, the full set of four statistical models as shown in Eqs. (18a)-(18d), which couples the four corresponding statistical model parameters and, particularly, the four channel lengths of the four different types of FETs together, must be reconstructed into a smaller, reconstructed set of statistical models as shown in Eqs. (38a)-(38b) below, which couples together the statistical model parameters and, particularly, the channel lengths of only the RVT nFET and RVT pFET that affect the performance target.

After reconstructing the full set of statistical models into the smaller, reconstructed set of statistical models (38a) and (38b), the initial simulation run for the corner model can be performed at process 902, as discussed above, to determine a nominal delay value ($\tau_{nom}$). Then, at process 904, only two additional simulation runs need to be performed with the channel lengths of RVT nFET and RVT pFET set, using the reconstructed set of statistical models of Eqs. (38a) and (38b), at different channel length values that are offset from their respective nominal channel length values in correlated ways. Specifically, for the first additional simulation run, the channel lengths ($C_{rvtn}$ and $L_{rvtp}$) of only the transistors RVT nFET and RVT pFET can be set such that they are offset along the $g_1$ direction (see Eqs. (39a)-(39b)). Based on the results of the first additional simulation run, a first corner performance value $\tau_1$ can be obtained. For a second additional simulation run, the channel lengths ($L_{rvtn}$ and $L_{rvtp}$) of only the transistors RVT nFET and RVT pFET can be set such that they are offset along the $g_2$ direction (see Eqs. (40a)-(40b)). Based on the results of the second additional simulation run, a second corner performance value $\tau_2$ can be obtained.

After obtaining nominal performance value $\tau_{nom}$ and two corner performance values $\tau_1$ and $\tau_2$, Eqs. (1a)-(1b) can further be used at process 906 to obtain the variance ($\sigma_{\tau,corner}^2$) and the standard deviation ($\sigma_{\tau,corner}$) of the performance target ($\tau$).

Also disclosed herein are embodiments of a computer program product. This computer program product can comprise a computer readable storage medium, which stores computer program code. The computer program code can be executable by a computer to perform the above-described method. More specifically, as will be appreciated by one skilled in the art, aspects of the disclosed techniques for generating a field effect transistor (FET) corner model for a given performance target (e.g., delay) can be embodied as a method, system or computer program product. Accordingly, aspects of these techniques may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the disclosed techniques may take the form of a computer program product embodied in one or more computer readable medium(s) having computer readable program code embodied thereon.

Any combination of one or more computer readable medium(s) may be utilized. The computer readable medium may be a computer readable storage device or a computer readable signal medium. A computer readable storage medium is a tangible medium and may be, but is not limited to, any of the following: an electronic, magnetic, optical, electromagnetic, infrared, or semiconductor system, apparatus, or device, or any suitable combination of the foregoing. More specific examples (a non-exhaustive list) of the computer readable storage medium would include, but is not limited to, the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage device may be any tangible medium that can contain, or store a program for use by or in connection with an instruction execution system, apparatus, or device.

As mentioned above, the computer readable medium can alternatively comprise a computer readable signal medium that includes a propagated data signal with computer readable program code embodied therein, for example, in baseband or as part of a carrier wave. Such a propagated signal may take any of a variety of forms, including, but not limited to, electromagnetic, optical, or any suitable combination thereof. This computer readable signal medium may be any computer readable medium that is not a computer readable storage medium and that can communicate, propagate, or transport a program for use by or in connection with an instruction execution system, apparatus, or device. Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the disclosed embodiments may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the disclosed method, system and computer program product are described above with reference to flowchart illustrations and/or block diagrams. It should be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer-implemented process such that the instructions which execute on the computer or other programmable apparatus provide processes for implementing the functions/acts specified in the flowchart and/or block diagram block or blocks.

Figure 3:
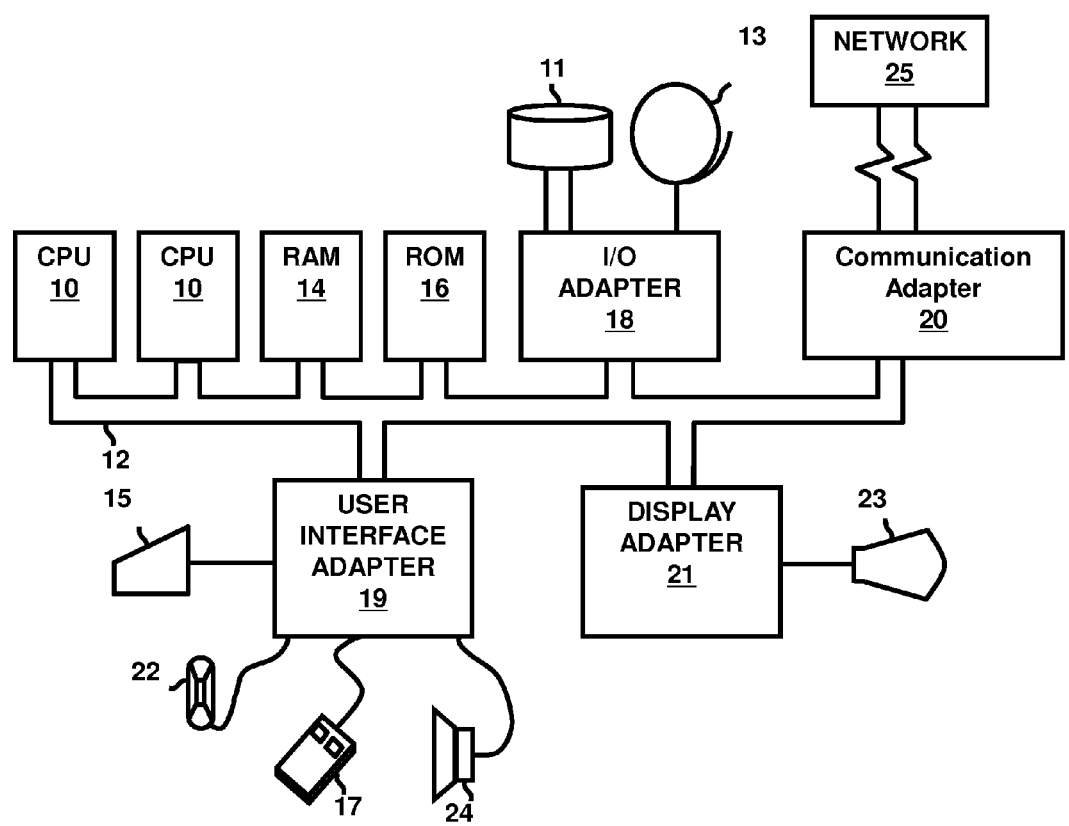
FIG. 3 is a schematic diagram illustrating an exemplary hardware environment for implementing systems, methods and computer program products disclosed herein.

FIG. 3 is representative hardware environment for implementing the above-disclosed system, method and/or computer program product. This schematic drawing illustrates a hardware configuration of a computerized device, such as an information handling/computer system. The computerized device comprises at least one processor or central processing unit (CPU) 10. The CPUs 10 are interconnected via bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the computerized device. The computerized device can read the inventive instructions on the program storage devices and follow these instructions to execute the methodology of the disclosed embodiments. The computerized device further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be noted that the terminology used herein is for the purpose of describing the system, method and computer program product and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including", specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Disclosed above are a system, method and computer program product for generating a field effect transistor (FET) corner model for a given performance target (e.g., delay) that accurately preserves partial correlations between corresponding statistical model parameters (e.g., channel lengths, threshold voltages, overlap capacitances, channel widths, etc.) of different types of field effect transistors within an integrated circuit. To accomplish this, an initial simulation run is performed to determine a nominal performance value (e.g., a nominal delay value) with all field effect transistors set at their nominal model parameter values (e.g., nominal channel length values, nominal threshold voltage values, nominal overlap capacitances, nominal channel lengths, etc.). Then, multiple additional simulation runs are performed to determine corner performance values (e.g., corner delay values). In each successive additional simulation run, the statistical model parameters of the different types of field effect transistors are properly set at different model parameters values (e.g., different channel length values, different threshold voltage values, different overlap capacitance values, different channel width values, etc.) that are offset from their nominal model parameter values in correlated ways. Then, based on performance differences between each of the corner performance values and the nominal performance value, a standard deviation for the performance target is determined. This technique preserves the partial correlations between the statistical model parameters of the different types of field effect transistors and does so without requiring the performance of a large number of simulations and without requiring knowledge of the sensitivities of the performance target.

What is claimed is:

1. A computer system comprising:
a memory storing a design for an integrated circuit comprising at least two different types of field effect transistors; and
at least one processor accessing said design in said memory and generating a corner model for a performance target that preserves partial correlations between corresponding statistical model parameter values of said at least two different types field effect transistors by performing the following:
performing an initial simulation run to determine a nominal performance value, said corresponding statistical model parameter values of said at least two different types of field effect transistors being set, during said initial simulation run, at nominal model parameter values for said at least two different types of field effect transistors, said at least two different types of field effect transistors comprising at least a first field effect transistor having a first nominal model parameter value and a second field effect transistor having a second nominal model parameter value;
performing multiple additional simulation runs to determine corner performance values, said corresponding statistical model parameter values of said at least two different types of field effect transistors being set, during each successive additional simulation run, at different predetermined statistical model parameter values for said at least two different types of field effect transistors that are offset from said nominal model parameters values for said at least two different types of field effect transistors such that, during each successive additional simulation run, a first predetermined statistical model parameter value for said first field effect transistor is offset from said first nominal model parameter value of said first field effect transistor and a second predetermined statistical model parameter value for said second field effect transistor is offset from said second nominal model parameter value of said second field effect transistor; and
determining a standard deviation for said performance target based on performance differences between each of said corner performance values and said nominal performance value.

2. The system of claim 1, said corresponding statistical model parameter values comprising any of channel length values, threshold voltage values, overlap capacitance values and channel width values.

3. The system of claim 1, said performance target comprising delay.

4. The system of claim 1, said determining of said standard deviation comprising solving a root sum of squares expression.

5. The system of claim 1,
said performing of said multiple additional simulation runs comprising, for each additional simulation run, setting said first predetermined statistical model parameter value for said first field effect transistor equal to said first nominal model parameter value for said first field effect transistor plus a first specific multiple of a standard deviation and setting said second predetermined statistical model parameter value for said second field effect transistor equal to said second nominal model parameter value for said second field effect transistor plus a second specific multiple of said standard deviation.

6. The system of claim 5, said first specific multiple and said second specific multiple comprising multiples associated with random variables representative of said partial correlations within a set of statistical models.

7. The system of claim 5, said first specific multiple and said second specific multiple each being between −3 and 3.

8. The system of claim 1, said at least two different types of field effect transistors comprising a total number K of different types of field effect transistors, said multiple additional simulation runs comprising a total number M of additional simulation runs, where said total number M is no greater than a product of said total number K of different types of field effect transistors and a number J of different types of statistical model parameters under consideration for each of said different types of field effect transistors.

9. A method comprising:
accessing, from a memory by a computer system, a design for an integrated circuit comprising at least two different types of field effect transistors; and
generating, by said computer, a corner model for a performance target that preserves partial correlations between corresponding statistical model parameter values of said at least two different types of field effect transistors, said generating comprising:

performing, by said computer system, an initial simulation run to determine a nominal performance value, said corresponding statistical model parameter values of said at least two different types of field effect transistors being set, during said initial simulation run, at nominal model parameter values for said at least two different types of field effect transistors, said at least two different types of field effect transistors comprising at least a first field effect transistor having a first nominal model parameter value and a second field effect transistor having a second nominal model parameter value;

performing, by said computer system, multiple additional simulation runs to determine corner performance values, said corresponding statistical model parameter values of said at least two different types of field effect transistors being set, during each successive additional simulation run, at different predetermined statistical model parameter values for said at least two different types of field effect transistors that are offset from said nominal model parameters values for said at least two different types of field effect transistors such that, during each successive additional simulation run, a first predetermined statistical model parameter value for said first field effect transistor is offset from said first nominal model parameter value of said first field effect transistor and a second predetermined statistical model parameter value for said second field effect transistor is offset from said second nominal model parameter value of said second field effect transistor; and, determining, by said computer system, a standard deviation for said performance target based on performance differences between each of said corner performance values and said nominal performance value.

10. The method of claim 9, said corresponding statistical model parameter values comprising any of channel length values, threshold voltage values, overlap capacitance values and channel width values.

11. The method of claim 9, said performance target comprising delay.

12. The method of claim 9, said determining of said standard deviation comprising solving a root sum of squares expression.

13. The method of claim 9,
said performing of said multiple additional simulation runs comprising, for each additional simulation run, setting said first predetermined statistical model parameter value for said first field effect transistor equal to said first nominal model parameter value for said first field effect transistor plus a first specific multiple of a standard deviation and setting said second predetermined statistical model parameter value for said second field effect transistor equal to said second nominal model parameter value for said second field effect transistor plus a second specific multiple of said standard deviation.

14. The method of claim 13, said first specific multiple and said second specific multiple comprising multiples associated with random variables representative of said partial correlations within a set of statistical models.

15. The method of claim 13, said first specific multiple and said second specific multiple each being between −3 and 3.

16. The method of claim 9, said at least two different types of field effect transistors comprising a total number K of different types of field effect transistors, said multiple additional simulation runs comprising a total number M of additional simulation runs, where said total number M is no greater than a product of said total number K of different types of field effect transistors and a number J of different types of statistical model parameters under consideration for each of said different types of field effect transistors.

17. A computer program product comprising a computer readable storage device storing computer program code, said computer program code being executable by a computer to perform a method, said method comprising:
accessing a design for an integrated circuit comprising at least two different types of field effect transistors; and
generating a corner model for a performance target that preserves partial correlations between corresponding statistical model parameter values of said at least two different types of field effect transistors, said generating comprising:
performing an initial simulation run to determine a nominal performance value, said corresponding statistical model parameter values of said at least two different types of field effect transistors being set, during said initial simulation run, at nominal model parameter values for said at least two different types of field effect transistors, said at least two different types of field effect transistors comprising at least a first field effect transistor having a first nominal model parameter value and a second field effect transistor having a second nominal model parameter value;
performing multiple additional simulation runs to determine corner performance values, said corresponding statistical model parameter values of said at least two different types of field effect transistors being set, during each successive additional simulation run, at different predetermined statistical model parameter values for said at least two different types of field effect transistors that are offset from said nominal model parameters values for said at least two different types of field effect transistors such that, during each successive additional simulation run, a first predetermined statistical model parameter value for said first field effect transistor is offset from said first nominal model parameter value of said first field effect transistor and a second predetermined statistical model parameter value for said second field effect transistor is offset from said second nominal model parameter value of said second field effect transistor; and
determining a standard deviation for said performance target based on performance differences between each of said corner performance values and said nominal performance value.

18. The computer program product of claim 17,
said corresponding statistical model parameter values comprising any of channel length values, threshold voltage values, overlap capacitance values and channel width values, and
said performance target comprising delay.

19. The computer program product of claim 17, said determining of said standard deviation comprising solving a root sum of squares expression.

20. The computer program product of claim 17,
said performing of said multiple additional simulation runs comprising, for each additional simulation run, setting said first predetermined statistical model parameter value for said first field effect transistor equal to said first nominal model parameter value for said first field effect transistor plus a first specific multiple of a standard deviation and setting said second predetermined statistical model parameter value for said second field effect transistor equal to said second nominal model parameter value for said second field effect transistor plus a second specific multiple of said standard deviation, and said first specific multiple and said second specific multiple comprising multiples associated with random variables representative of said partial correlations within a set of statistical models.

* * * * *